(12) United States Patent
Widdershoven et al.

(10) Patent No.: US 10,998,489 B2
(45) Date of Patent: May 4, 2021

(54) MAGNETIC SHIELDING STRUCTURE FOR MRAM ARRAY

(71) Applicant: NXP B.V., Eindhoven (NL)

(72) Inventors: Franciscus Petrus Widdershoven, Eindhoven (NL); Antonius Hendrikus Jozef Kamphuis, Lent (NL)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 16/246,925

(22) Filed: Jan. 14, 2019

(65) Prior Publication Data

US 2020/0227624 A1 Jul. 16, 2020

(51) Int. Cl.
*H01L 43/02* (2006.01)
*H01L 27/22* (2006.01)

(52) U.S. Cl.
CPC .......... *H01L 43/02* (2013.01); *H01L 27/222* (2013.01)

(58) Field of Classification Search
CPC ............................ H01L 43/02; H01L 27/222
See application file for complete search history.

(56) References Cited

U.S. PATENT DOCUMENTS

| | | | |
|---|---|---|---|
| 9,349,942 B2 | 5/2016 | Fujimori | |
| 9,508,657 B2 * | 11/2016 | Lee | .......... H01L 23/552 |
| 9,564,403 B2 | 2/2017 | Allinger et al. | |
| 10,074,799 B2 * | 9/2018 | Jang | .......... H01L 23/06 |
| 2006/0289970 A1 | 12/2006 | Gogl et al. | |
| 2008/0122047 A1 * | 5/2008 | Honer | .......... H01L 23/552 257/660 |
| 2012/0119338 A1 * | 5/2012 | Watanabe | .......... H01L 23/13 257/659 |
| 2012/0193737 A1 * | 8/2012 | Pang | .......... H01L 21/561 257/421 |
| 2013/0105950 A1 * | 5/2013 | Bergemont | .......... H01L 23/552 257/659 |
| 2013/0256819 A1 * | 10/2013 | Watanabe | .......... H01L 43/02 257/422 |
| 2014/0197505 A1 * | 7/2014 | Zhou | .......... H01L 23/552 257/422 |
| 2015/0162283 A1 * | 6/2015 | Popelar | .......... H01L 23/552 257/659 |
| 2015/0243607 A1 * | 8/2015 | Jang | .......... H01L 24/73 438/113 |

(Continued)

OTHER PUBLICATIONS

Bhushan et al., "Enhancing Magnetic Immunity of STT-MRAM with Magnetic Shielding," 2018 IEEE International Memory Workshop, 4 pages.

(Continued)

*Primary Examiner* — Eugene Lee

(57) ABSTRACT

Embodiments are provided for a packaged semiconductor device including: a semiconductor die having an active side and an opposite back side, the semiconductor die including a magnetoresistive random access memory (MRAM) cell array formed within an MRAM area on the active side of the semiconductor die; and a top cover including a soft-magnetic material positioned on the back side of the semiconductor die, wherein the top cover includes a recess formed in a first major surface of the top cover, the first major surface faces the back side of the semiconductor die, and the recess is positioned over the MRAM cell array.

19 Claims, 11 Drawing Sheets

(56) References Cited

U.S. PATENT DOCUMENTS

| | | | |
|---|---|---|---|
| 2015/0243881 A1* | 8/2015 | Sankman | H01L 23/295 |
| | | | 361/679.55 |
| 2015/0333018 A1* | 11/2015 | Kim | H01L 43/02 |
| | | | 257/422 |
| 2016/0284761 A1* | 9/2016 | Zhou | H01L 43/10 |
| 2016/0359100 A1 | 12/2016 | Bhushan et al. | |
| 2018/0323170 A1* | 11/2018 | Kim | H01L 21/56 |
| 2019/0051613 A1* | 2/2019 | Ugge | H01L 23/49866 |
| 2019/0115292 A1* | 4/2019 | Morrison | H01L 23/49816 |
| 2019/0214550 A1* | 7/2019 | Bhushan | H01L 24/05 |
| 2019/0229068 A1* | 7/2019 | Bhushan | G11C 11/161 |

OTHER PUBLICATIONS

Watanabe et al., "A Novel U-shaped Magnetic Shield for Perpendicular MRAM," 2012 IEEE 62nd Electronic and Technology Conference, 6 pages.

* cited by examiner

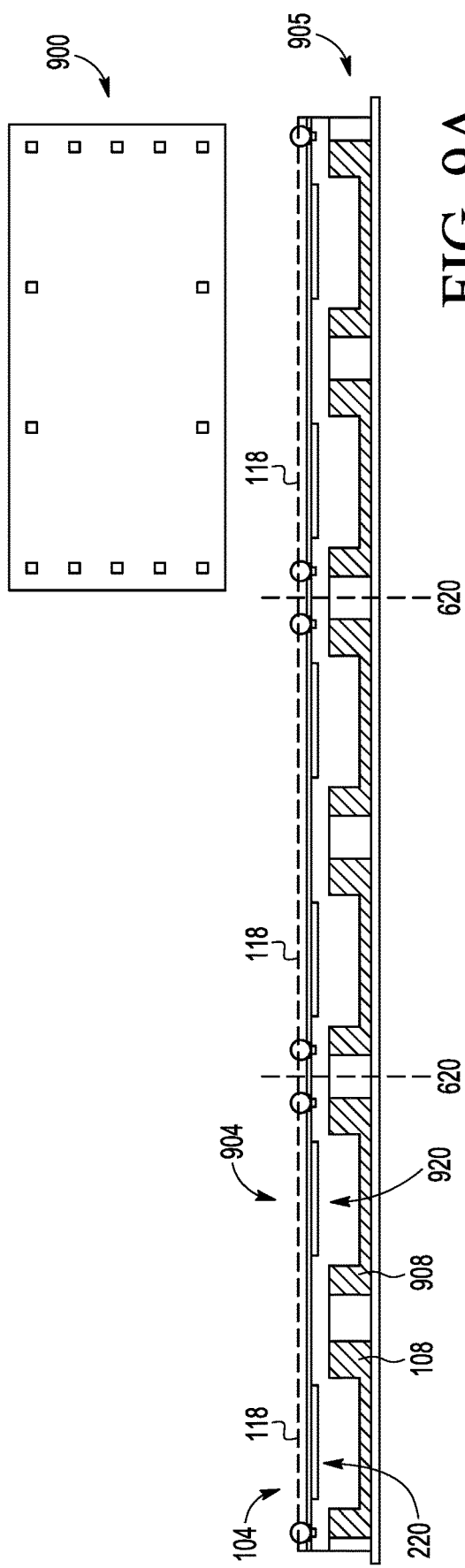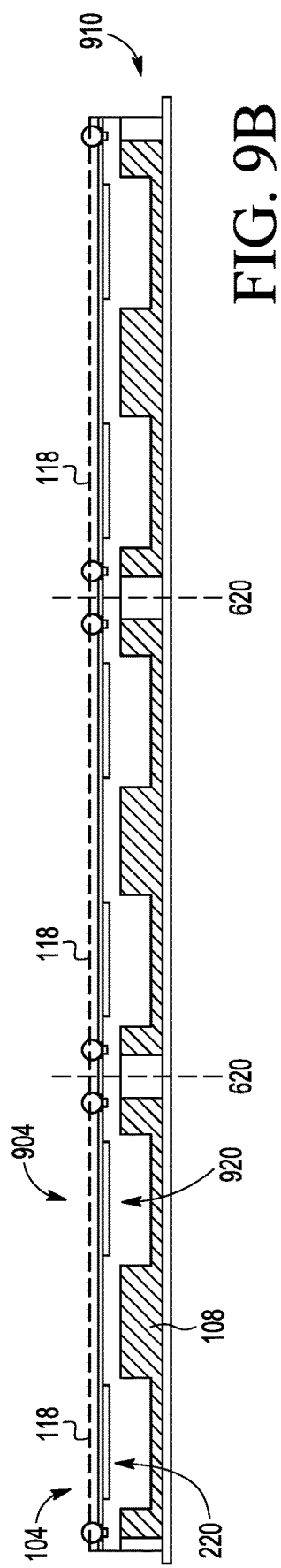

MAGNETIC SHIELDING STRUCTURE FOR MRAM ARRAY

BACKGROUND

Field

This disclosure relates generally to magnetoresistive random access memory (MRAM) systems, and more specifically, to magnetic shielding for MRAM.

Related Art

In contrast to Random Access Memory (RAM) technologies that use electric charges to store data, MRAM is a memory technology that uses magnetic polarization to store data. One primary benefit of MRAM is that it retains the stored data in the absence of applied system power, making it a non-volatile memory suitable for implementation in a variety of devices. While MRAM technology is relatively new, it has significant application opportunities.

BRIEF DESCRIPTION OF THE DRAWINGS

The present invention may be better understood, and its numerous objects, features, and advantages made apparent to those skilled in the art by referencing the accompanying drawings.

FIGS. 9A and 9B are block diagrams depicting example device views of representative process steps of a wafer level process for fabricating packaged semiconductor devices including magnetic shielding structures for MRAM subarrays, according to some embodiments of the present disclosure.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Generally, a magnetoresistive random access memory (MRAM) includes a large number of magnetic bit cells formed on a semiconductor substrate, where each cell represents one data bit. Information is written to a bit cell by changing the magnetization direction of a magnetic element within the bit cell, and a bit cell is read by measuring the resistance of the bit cell (e.g., low resistance typically represents a "0" bit and high resistance typically represents a "1" bit). The bit cells are programmed using programming lines, often called bit lines and digit (or word) lines.

One drawback to a memory array implemented using MRAM cells is the lack of immunity to magnetic fields in the ambient environment, which may disturb or corrupt the data value stored by a number of magnetic bit cells by flipping the magnetization direction. Managing potential latent read failures is a large hurdle to enable MRAM for mainstream applications.

The present disclosure provides a magnetic shielding structure made of a soft magnetic material with high relative permeability that redirects magnetic flux around an MRAM cell array, lowering the magnetic field strength at the MRAM array and suppressing any magnetic field disturbs that would otherwise occur. In some embodiments, the magnetic shielding structure includes a top cover that fits over a portion of a semiconductor die that includes an MRAM array. In some embodiments, a back side of the semiconductor die is thinned in an area around the MRAM array, leaving a thicker portion of the semiconductor die over the MRAM array. In such embodiments, the top cover has a recess into which the thicker portion of the semiconductor die fits. In other embodiments, the entire back side of the semiconductor die is thinned, where the top cover has a recess positioned over the MRAM array. In both type of embodiments, the recess provides a magnetic resistance greater than the magnetic resistance of the shielding structure, which redirects magnetic flux around the MRAM cell array when magnetic induction perpendicular to the substrate is encountered. The magnetic shielding structure also includes a bottom cover that spans the active side of the semiconductor die, with openings for external connections of the packaged semiconductor device.

Example Embodiments

Figure 1A:
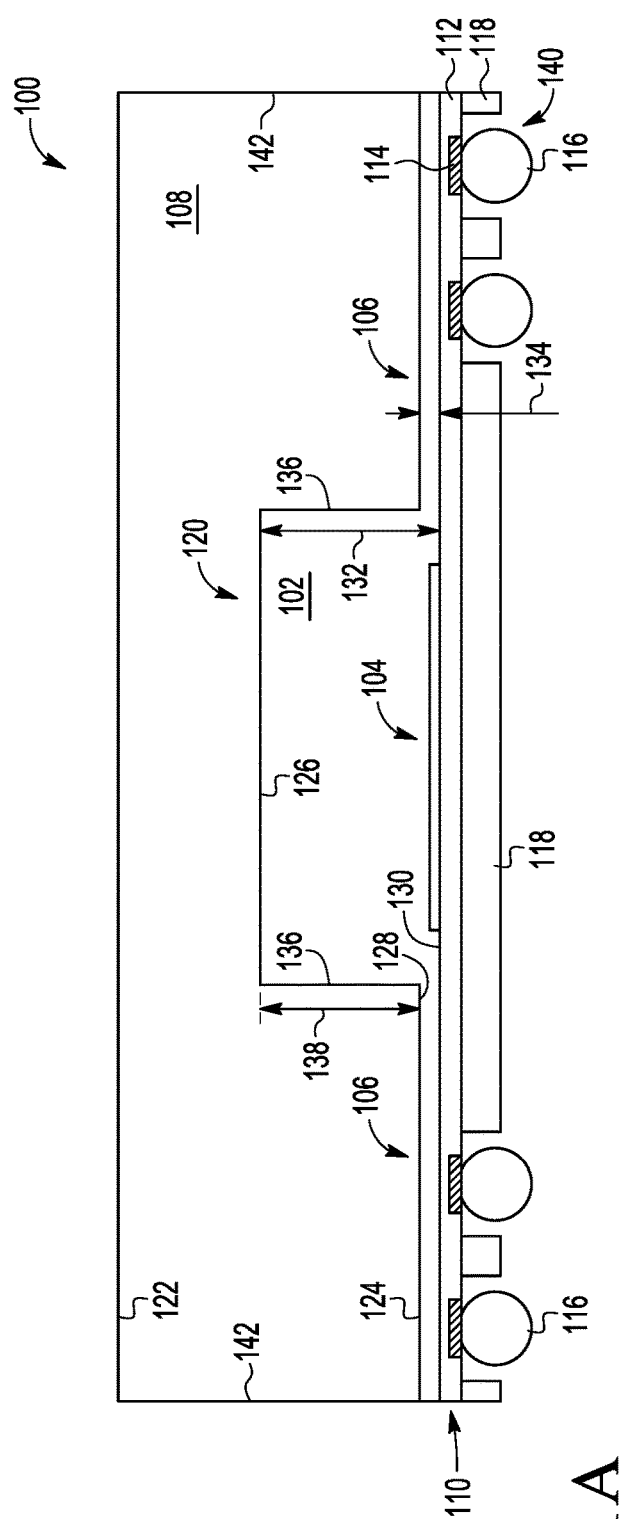
FIGS. 1A and 1B are block diagrams depicting an example packaged semiconductor device including a magnetic shielding structure for MRAM array, according to some embodiments of the present disclosure.

FIG. 1A shows a cross-sectional view and 1B shows a planar bottom-up view of an example packaged semiconductor device 100 that includes a magnetic shielding structure for MRAM array. In the embodiment shown, device 100 includes a semiconductor die 102 that in turn includes an MRAM array 104 formed in an active side 130 of the die 102. Device 100 also includes a magnetic shielding structure that is formed from a top cover 108 and a bottom cover 118, where a recess is aligned over the MRAM array 104, as further discussed below. In the embodiment shown, device 100 also includes a redistributed layer (RDL) structure 110 formed over the active side 130 of die 102, and a plurality of external connections 116 attached to pads 114 formed on an outermost surface of RDL structure 110, where a plurality of openings 140 in the bottom cover 118 are aligned to the pads 114 and attached external connections 116. These components are further discussed below.

Die 102 is shown in an active side face-down orientation in FIG. 1A. The active side 130 of die 102 includes an MRAM array 104 (as indicated by block 104 that spans the area in which the MRAM array is formed on the active side 130) and active circuitry 106 implemented laterally outside of the MRAM array 104 (e.g., on left and right sides of the block 104). MRAM array 104 includes a plurality of MRAM bit cells that are arranged in one or more sub-arrays. Different embodiments of the magnetic shielding structure for one or more sub-arrays are further discussed below. Active circuitry 106 includes electronic components such as processors, memory, logic, analog circuitry, passive devices, and the like. Supporting circuitry for the MRAM array 104, such as a memory controller and access circuitry for reading from and writing to the MRAM bit cells, may also be implemented in the active circuitry 106 near the MRAM array 104.

Die 102 is implemented on a semiconductor substrate. The MRAM array 104 and the active circuitry 106 are formed using a plurality of process steps on a first side of the semiconductor substrate, which becomes the active side 130. The remaining portion of the semiconductor substrate behind the active side 130 is referred to as bulk silicon. While this remaining portion is generally referred to as bulk silicon, this portion (and the semiconductor substrate) can be any semiconductor material or combinations of materials, such as gallium arsenide, silicon germanium, silicon-on-insulator (SOI), silicon, monocrystalline silicon, the like, and combinations of the above.

Figure 2:
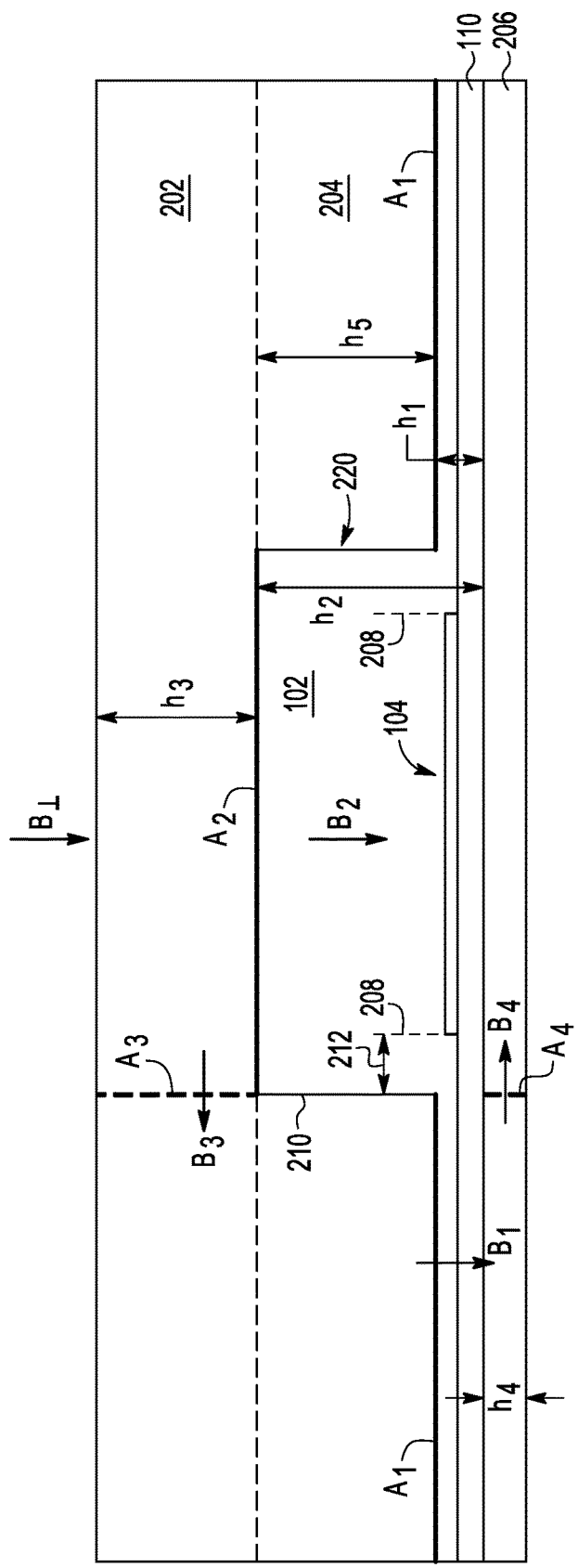
FIGS. 2 and 3 are block diagrams depicting aspects of an example magnetic shielding structure for an MRAM array, according to some embodiments of the present disclosure.

Die 102 includes a stack 120 of bulk silicon over MRAM array 104 and extending laterally beyond an outer perimeter of MRAM array 104 by some distance, where the MRAM array and the lateral distance is also referred to as an MRAM array area, as further discussed in FIG. 2. Stack 120 has a height (or thickness) 132 measured from the active side 130, forming a top surface 126 (also referred to as a first back side 126 of die 102) and sidewalls 136. The remaining area of die 102 is thinner (as compared with stack 120), having a height (or thickness) 134 measured from the active side 130, where height 134 is less than height 132. The area outside of the MRAM array area has a top surface 128 (also referred to as a second back side 128 of die 102). Since the area outside of the MRAM array area includes active circuitry 106, the area outside of the MRAM array area is also referred to as active circuitry area 106, or simply area 106. Such a "top hat" shape may be attained by removing a portion of the bulk silicon of the die 102 from the area 106 outside of the MRAM array area (where the MRAM array area includes the MRAM array 104 and some lateral distance surrounding the MRAM array 104), as further discussed below in connection with FIGS. 5D and 5E.

Figure 5A:
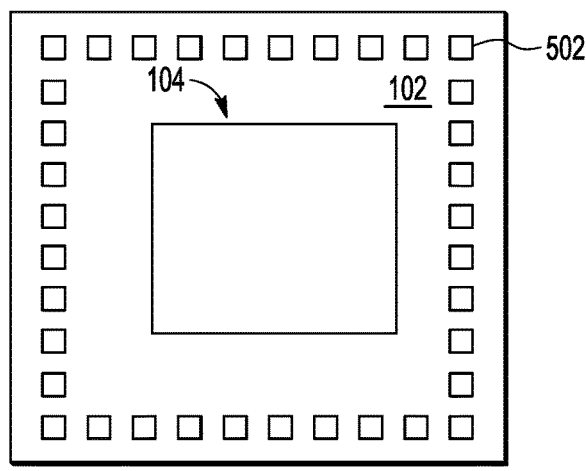
FIGS. 5A, 5B, 5C, 5D, 5E, 5F, 5G, 5H, 5I, and 5J are block diagrams depicting an example process for fabricating a packaged semiconductor device including a magnetic shielding structure for MRAM array, according to some embodiments of the present disclosure.

Active side 130 also includes a plurality of die pads, which are not shown in FIG. 1A for simplicity's sake, but are shown as die pads 502 in FIG. 5A and subsequent figures. The die pads may be arranged in various locations on the active side 130, such as in one or more rows around the periphery of the die 102, or in other arrangements such as arranged near the center of the die 102. Each die pad may be electrically coupled to active circuitry 106 implemented in active side 130 of die 102. In the embodiment shown, the lateral edges of the die 102 also form part of the lateral edges of the device 100, where the lateral edges of the die 102 and device 100 are perpendicular to the active and back sides 126 and 130 of the die 102.

A number of build-up layers are formed over the active side 130 of the die 102 to form a redistributed layer (RDL) structure 110. Build-up layers may include a number of conductive layers, including layers that form conductive structures and dielectric layers (including layer 112) that insulate the conductive structures. External connection pads 114 are also formed on an outermost dielectric surface of the RDL structure 110, where the conductive structures of the RDL structure 110 include traces (e.g., implement redistributed routing paths) from pads (502) on the die 102 to the external connection pads 114 at different locations relative to the active side 130 of the die 102. Each of the external connection pads 114 also have an attached external connection 116, such as a solder bump, copper pillar, nickel pillar, or other suitable connection. The RDL structure 110 has a substantially uniform height at least on the outermost dielectric surface of the RDL structure 110, where the external connection pads 114 may extend beyond the outermost dielectric surface of the RDL structure 110. It is noted that the use of metal pillars, such as nickel pillars, may require additional consideration due to the heightened magnetic permeability of some metals, as further discussed below.

Dielectric layers of the RDL structure 110 are formed from dielectric material, examples of which may include but are not limited to silicon oxide, silicon nitride, silicon dioxide, silicon oxynitride, polyimide, other suitable materials including oxides, nitrides, and the like. Conductive layers of the RDL structure 110 are formed from an electrically conductive material, examples of which include but are not limited to nickel, gold, copper, aluminum, or other suitable conductive metal or alloy composed of one or more suitable conductive metals. The external connection pads 114 may be coated with an electrically conductive material, examples of which include nickel, gold, copper, aluminum, tin, silver, titanium, or other suitable conductive metal or alloy composed of one or more suitable conductive metals in order to improve the "bondable" nature of the pads 114. In some embodiments, the external connection pads 114 may include under-bump metallization (UBM) to improve wettability and adhesion of external connections (such as solder bumps 116), which is formed from a thin film stack of one or more electrically conductive metals, examples of which include but are not limited to nickel, gold, copper, aluminum, titanium, tungsten, chromium, palladium, or other suitable conductive material or alloy composed of one or more suitable conductive materials.

The magnetic shielding structure includes top cover 108 over the back side of die 102, which in the embodiment shown includes back sides 126 and 128 of die 102, and bottom cover 118 over the active side 130. The top and bottom covers 108 and 118 are formed from a soft magnetic material, which is a material that is configured to be magnetized in a magnetic field and is not magnetized when the magnetic field is removed (as compared with a hard magnetic material, that remains magnetized even when the magnetic field is removed). Soft magnetic materials are generally characterized by their high relative permeability ($\mu R$). Permeability is generally the measure of the ability of a material to support the formation of a magnetic field within itself, and relative permeability ($\mu R$) is the ratio of the permeability of a given material to the permeability of vacuum ($\mu 0$). Example relative permeability values ($\mu R$) of soft magnetic materials run from 50 (e.g., nickel-zinc ferrite) to 500 (e.g., manganese-zinc ferrite), or 5,000 (e.g., iron), or 20,000 (e.g., mu-metal) or even greater (e.g., 200,000 of 99.95% pure iron). Examples of soft magnetic material include but are not limited to iron, iron and low-carbon steels, iron-silicon alloys, iron-aluminum-silicon alloys, nickel-iron alloys (e.g., mu-metals), iron-cobalt alloys, ferrites, amorphous alloys, and ceramics formed from an iron oxide with one or more divalent oxides (such as NiO, MgO, or ZnO).

Top cover 108 has a first major surface 124 and an opposite second major surface 122, with lateral edges 142 that are perpendicular to the first and second major surfaces 124 and 122. In the embodiment shown, lateral edges 142 of top cover 108 extend to and are parallel with the lateral edges of the die 102, forming a device edge. In some embodiments, the lateral edges 142 may not reach lateral edges of the die 102 (like that shown in FIG. 5F), while in other embodiments, the lateral edges 142 may exceed lateral edges of the die 102 (e.g., when the top cover 108 has a larger lateral perimeter than die 102). In some embodiments, top cover 108 is formed as a separate piece (which may have a lateral perimeter smaller, equal to, or larger than a lateral perimeter of the die 102) that includes a recess formed in the first major surface 124, which is the surface facing the die 102. The recess is formed to a depth 138, which is equivalent to the difference between the back sides 126 and 128 of die 102, which is also the distance by which the stack 120 extends beyond the (thinner) back side 128. The recess is shaped to fit over and around the stack 120, where the size of the recess (e.g., the width, length, and depth of the recess) corresponds to the size of the stack 120 (e.g., the width, length, and height of the stack 120). The top cover 108 may be attached to the back side(s) of die 102, such as by using an adhesive like that discussed in connection with FIG. 5F, or may be secured in place by mold compound, discussed in connection with FIG. 5G. In other embodiments, the top cover 108 may be formed directly onto the back side of the die 102 by deposition of the soft-magnetic material, followed by planarization. Embodiments of the top cover 108 and recess (labeled as recess 220) are further discussed below in connection with FIG. 2 and FIG. 5F.

Figure 1B:
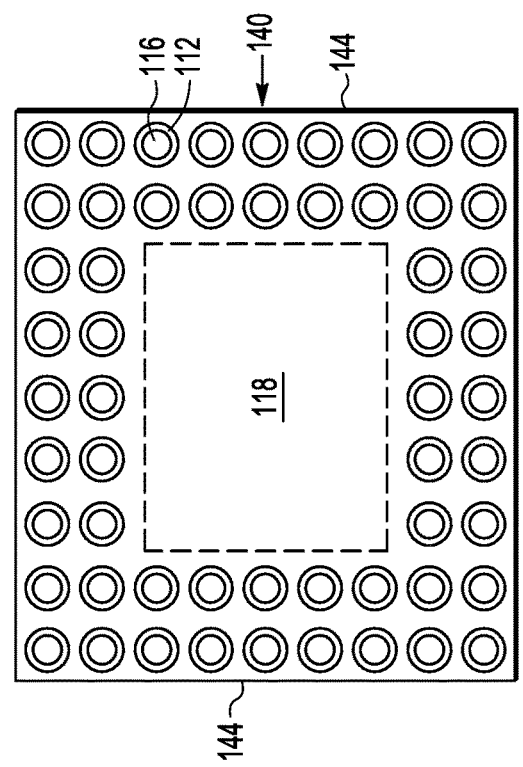
Figure 10A:
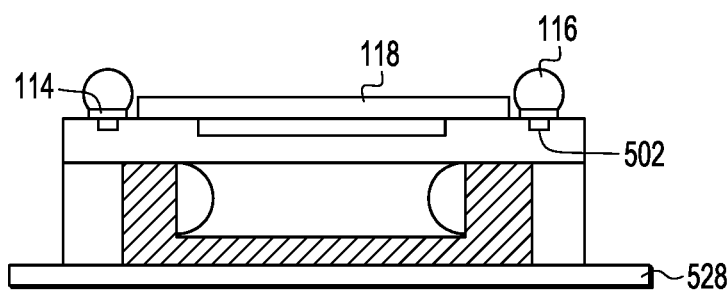
FIGS. 10A and 10B are block diagrams depicting example device view of additional embodiments of packaged semiconductor devices, according to some embodiments of the present disclosure.
Figure 10B:
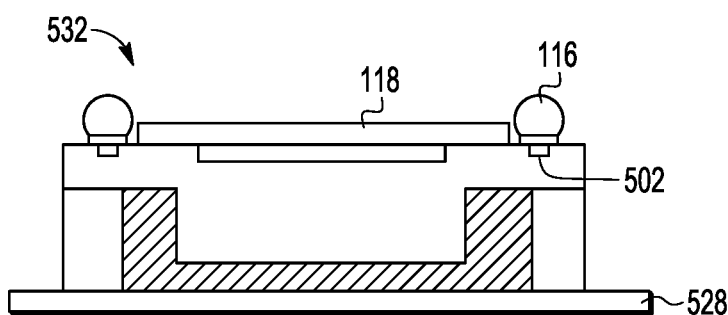

Bottom cover 118 is a plate-shaped structure that has a first major surface on the outermost surface of the RDL structure 110. In some embodiments, bottom cover 118 is formed as a separate piece which is attached to the outermost surface of the RDL structure 110, such as by using an adhesive. The opposite second major surface of bottom cover 118 is shown in the planar bottom-up view of FIG. 1B. Bottom cover 118 includes a plurality of openings 140 that extend through the plate (e.g., from the first to the second major surface) and are aligned to the external connection pads 114. Each opening 140 has a width large enough to accommodate the external connections 116 (such as the diameter of a solder bump or metal pillar), which may allow the bottom cover 118 to be attached after the external connections 116 are attached to pads 114. In other embodiments, the bottom cover 118 may be formed directly onto the RDL structure 110 by deposition of the soft-magnetic material, followed by planarization and etching of the openings 140, which are aligned to the external connection pads 114. In such an embodiment, attachment of the external connections 116 occurs after the openings 140 are formed. In other embodiments, the bottom cover 118 may be attached directly to the bottom surface of the die 102, such as in embodiments without an RDL structure 110 where external connections 116 are attached directly to pads 502, as shown in FIGS. 10A and 10B.

Lateral edges 144 of the bottom cover 118 are perpendicular to the first and second major surfaces of the bottom cover 118. In the embodiment shown, lateral edges 144 of the bottom cover 118 extend to and are parallel with the lateral edges of the top cover 108 and die 102, continuing the package edge. In the embodiment shown, the thickness of the bottom cover 118 is less than the thickness or height of the external connections 116 (such as a height of a solder bump or metal pillar), ensuring that the bottom cover 118 does not interfere with attachment of the device 100 to a carrier substrate, such as a printed circuit board (PCB).

In the embodiment shown, bottom cover 118 has a plurality of openings 140 aligned to external connections 116 and pads 114, which are located around the periphery of the die 102 (e.g., in two rows). Preferably, the external connections 116 and pads 114 are located outside of the MRAM array area. It is noted that such an embodiment is preferred due to having a solid, unbroken, continuous plate portion of the bottom cover 118 underneath the MRAM array 104 (e.g., no openings 140 underneath the MRAM array 104), as indicated by the central portion in broken outline in FIG. 1B. In some embodiments, the bottom cover 118 may be formed as simply the central portion in broken outline, without requiring openings 140 around the peripheral edges, where such an embodiment of the bottom cover 118 still extends over a portion of the top cover, as shown in FIGS. 10A and 10B. However, in other embodiments, external connections 116 and pads 114 may be located near the center of the die 102 underneath the MRAM array 104, in which case bottom cover 118 also has aligned openings 140 underneath the MRAM array 104. Such an embodiment still provides shielding of the MRAM array 104, although it may be less effective than the embodiment of the continuous plate portion.

It is also noted that the use of metal pillars may require additional consideration due to the heightened magnetic permeability of some metals, such as nickel, as compared to other metals or alloys used for external connections. Since the high magnetic permeability of some metals may attract magnetic field lines from the environment, the placement of a given metal pillar depends on the geometry of the given metal pillar relative to the surrounding magnetic materials like the bottom cover 118, as well as to other metal pillars. While metal pillars are generally referred to herein, it is understood that the use of such metal pillars may require additional configuration restrictions relative to the magnetic shielding structure that are not discussed herein.

FIG. 2 shows a cross-sectional and simplified view of device 100, including the magnetic shielding structure, for modeling magnetic behavior. Top cover 108 is modeled into two components with uniform thickness: a "flat" top portion 202 having a uniform height h3 (which is the height of the top cover 108 above the stack 120) and a "ring" shaped sidewall portion 204 having a uniform height h5 (which is the height of the top cover 108 up to a plane defined by top surface 126 of stack 120) and inner sidewalls 210 formed by recess 220. Bottom cover 118 is modeled as a plate portion 206 without the plurality of openings 140, having a uniform height h4. It is noted that the approximate effect of openings 140 can be accounted for in the model by using an effective thickness h4 that is smaller than the physical thickness of the bottom cover. The sidewall portion 204 is separated from the plate portion 206 by height h1 in the area 106 (which includes a height of the thinned portions of die 102 and a height of the RDL structure 110), and the sidewall flat top portion 202 is separated from the plate portion 206 by height h2 in the MRAM array area (which includes a height of the stack 120 and a height of the RDL structure 110). Thus, the top cover 108 and the bottom cover 118 (which have high magnetic permeability) are separated by gaps h1 and h2 of material with low magnetic permeability.

The size of recess 220 generally corresponds to the size of the MRAM array area. The MRAM array area includes both an area of the MRAM array 104, which is marked as perimeter 208, and a lateral distance 212 beyond the perimeter 208. The lateral distance 212 (where "lateral" indicates the distance is measured in the sideways direction parallel to the plane of the active side 130 of the die 102) is included in order to ensure that recess 220 surrounds all MRAM bit cells within MRAM array 104, accounting for any misalignment within some predefined tolerance margins. As a result, the inner sidewalls 210 formed by recess 220 fall outside of the perimeter 208 by the lateral distance 212. The lateral distance 212 also prevents magnetic fringe fields that emerge from the lower corners of the top cover 108 at the outer edge of gap h1 from reaching the MRAM bit cells. The lateral distance 212 preferably should be at least the same size as h1.

Figure 3:
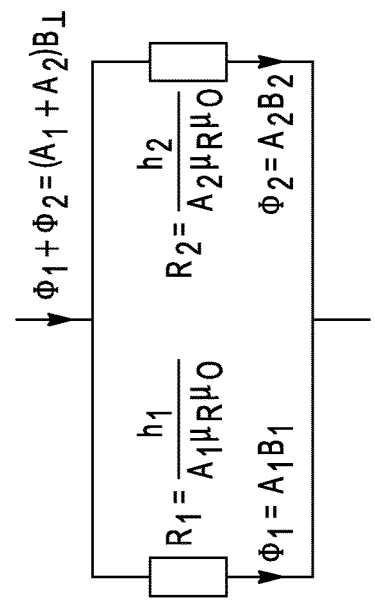
Figure 4A:
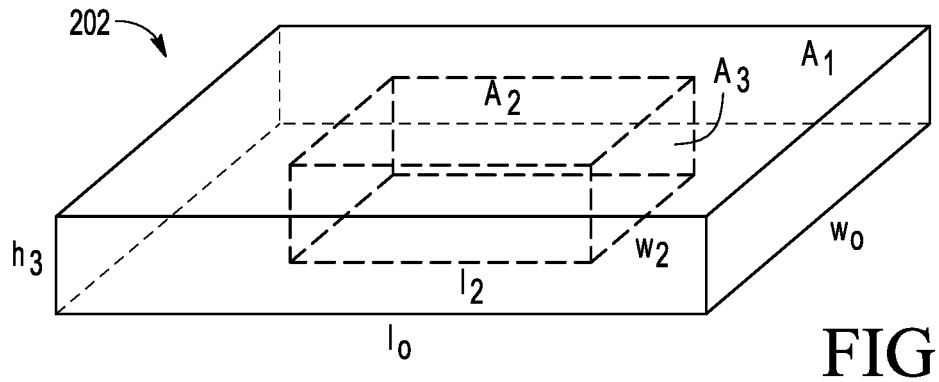
FIGS. 4A, 4B, and 4C are block diagrams depicting example portions of a magnetic shielding structure for MRAM array, according to some embodiments of the present disclosure.
Figure 4B:
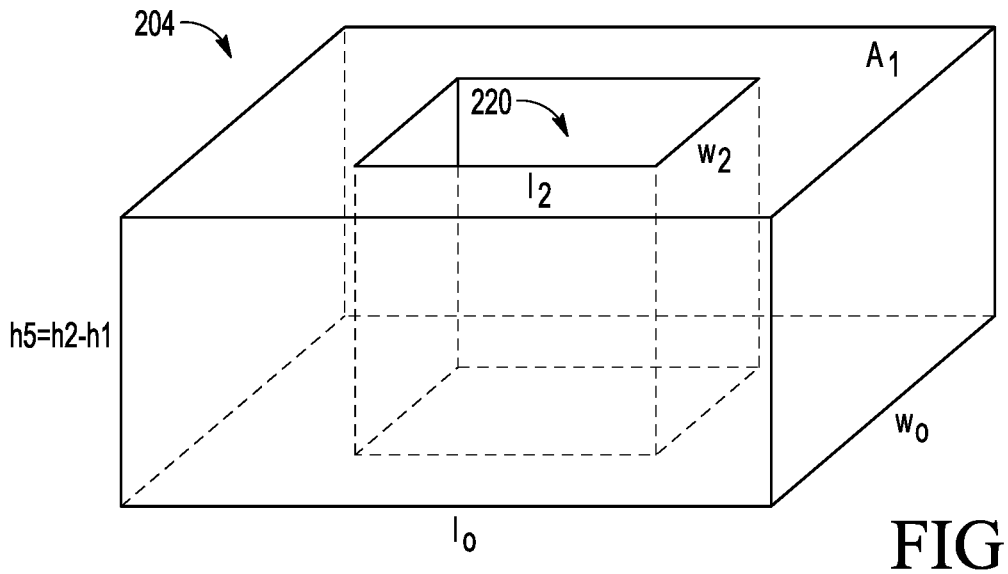
Figure 4C:
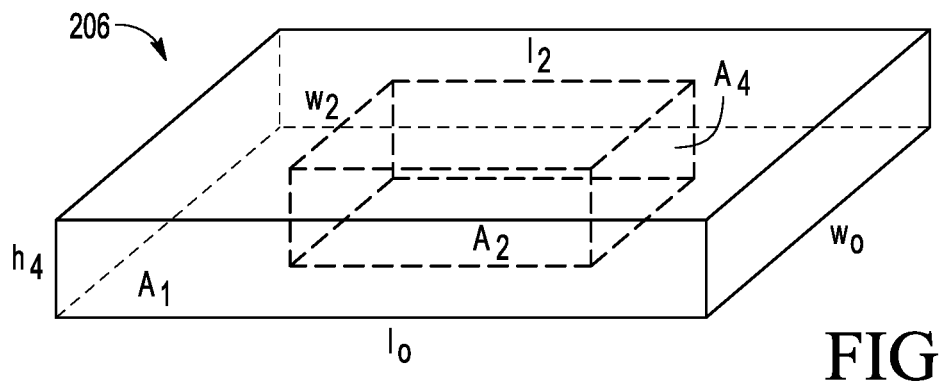

FIG. 4A shows a perspective view of the flat top portion 202 of the top cover 108, FIG. 4B shows a perspective view of the sidewall portion 204 of the top cover 108, and FIG. 4C shows a perspective view of the plate portion 206 of the bottom cover 118. Flat top portion 202 and plate portion 206 are modeled as solid pieces of soft magnetic material, and sidewall portion 204 is modeled as a solid piece of soft magnetic material with a recess 220 passing through the entirety of portion 204 (e.g., the recess 220 forms a hole or space through the sidewall portion 204). The inner sidewalls 210 of recess 220 are extrapolated up into the flat top portion 202 and down into the plate portion 206 for the sake of calculating a magnetic saturation threshold, which is further discussed below in connection with FIG. 3.

In FIG. 4A, the flat top portion 202 has a planar top surface (e.g., in the horizontal x-y plane relative to the drawing) having a length lo in a first lateral direction (e.g., in the left to right direction relative to the drawing) and a width wo in a second lateral direction (e.g., in a direction into and out of the page) that forms an overall area Ao, which can be expressed as Ao=lo×wo. Area Ao of the flat top portion 202 is divided into two portions: A1 and A2. A2 is the cross-sectional area of the recess 220, which spans the MRAM array area that includes both the MRAM array 104 and the lateral distance 212 (which is demarcated by the extrapolation of the inner sidewalls 210 of the recess 220). A1 is the remaining area outside of area A2. Portions of A1 and A2 are also represented in the cross-sectional view of FIG. 2 as thickened horizontal lines respectively labeled A1 and A2. Area A2 has a length l2 in the first lateral direction and a width w2 in the second lateral direction, although other shaped recesses 210 may be formed in other embodiments (e.g., square, circular, oblong). Accordingly, area A2 may be expressed as A2=l2×w2, and area A1 may be expressed as A1=Ao−A2. Additionally, the thickness or height of the flat top portion 202 is h3, where a critical vertical cross-sectional area A3 may be defined at the extrapolation of the inner sidewalls 210. Area A3 includes all four vertical areas corresponding to the extrapolation of the inner sidewalls 210 within the flat top portion 202, and can be expressed as A3=2(l2+w2)h3. An example portion of area A3 is also represented as a thickened vertical broken line in parallel with sidewall 210 in FIG. 2.

In FIG. 4B, the sidewall portion 204 has a planar top surface having area A1, where the outer perimeter of A1 is length lo and width wo, and the inner perimeter of A1 is length l2 and width w2. The sidewall portion 204 has a thickness or height of h5 equal to h2 minus h1, where h2 is the combined height of the die 102 in the MRAM array area plus the height of the RDL structure 110, and h1 is the combined height of the die 102 in the active circuitry area plus the height of the RDL structure 110, as shown in FIG. 2.

In FIG. 4C, the plate portion 206 has a planar top surface having an area equal to A1 plus A2. The plate portion 206 has a thickness or height h4, where a critical vertical cross-sectional area A4 may be defined at the extrapolation of the inner sidewalls 210. Area A4 includes all four vertical areas corresponding to the extrapolation of the inner sidewalls 210 within the plate portion 206, and can be expressed as A4=2(l2+w2)h4. An example portion of area A4 is also represented as a thickened vertical broken line in parallel with sidewall 210 in FIG. 2.

Returning to FIG. 2, when magnetic induction $B^\perp$ (also referred to as magnetic flux density $B^\perp$, also pronounced as B perpendicular) is encountered, the magnetic shielding structure is configured to reroute the magnetic flux around the MRAM array 104. It is noted that the simple calculations used herein provide approximations of the distribution of the magnetic induction in the shielding structure. For other embodiments where the shielding structure is thinner than its lateral dimensions, these approximations are sufficiently accurate for engineering purposes (e.g., for designing effective shielding structures). However, numerical simulations may be required for solving the full 3-dimensional distribution of the magnetic induction in the device.

In the example shown in FIG. 2, BL enters a top surface (having area Ao) of the flat top portion 202 and travels downward in the perpendicular direction (or a downward direction relative to FIG. 2), providing a magnetic flux of $Ao \cdot B^\perp$, which is equal to $(A1+A2) \cdot B^\perp$. A first magnetic flux $\varphi 1$ is defined as magnetic induction B1 passing perpendicular through cross-sectional area A1 outside of the MRAM array area (where $\varphi 1 = A1 \cdot B1$). A second magnetic flux $\varphi 2$ is defined as magnetic induction B2 passing perpendicular through cross-sectional area A2 within the MRAM array area (where $\varphi 2 = A2 \cdot B2$), which exits the flat top portion 202 and continues traveling downward through the MRAM array area.

Magnetic induction B1 may also include a portion $A3 \cdot B3$ of the flux $A2 \cdot B^\perp$ within flat top portion 202 within the MRAM array area (or area A2) that is redirected to outside of the MRAM array area (or area A1), where B3 is the magnetic induction perpendicular to cross-sectional area A3 (in the lateral direction). In other words, $\varphi 1 = A1 \cdot B1 = A1 \cdot B^\perp + A3 \cdot B3$. A portion $A4 \cdot B4$ of the flux $A1 \cdot B^\perp$ may also be redirected through the plate portion 206 toward the MRAM array 104, where B4 is the magnetic induction perpendicular to cross-sectional area A4 (also in the lateral direction).

Generally, the magnetic induction B2 that passes through the MRAM array 104 should be minimized to avoid any disturbs at the MRAM array 104, which can be achieved due to the design of the magnetic shielding structure to remain under a magnetic saturation threshold. Saturation occurs when an increase in $B^\perp$ cannot increase the magnetization of the magnetic shielding structure any further, where the magnetic flux density levels off. In some embodiments, the critical or maximum field strength of a magnetic field experienced at the MRAM array 104 without causing disturbs is 0.15 Tesla (T), although such field strength may be lesser or greater in other embodiments, depending on the magnetic immunity of the type of MRAM bit cells used in the MRAM array 104. B2 is targeted to be less than the critical field strength.

The magnetic saturation threshold can be determined using the magnetic shielding structure's equivalent magnetic circuit schematic in FIG. 3. The simplified circuit in FIG. 3 provides an accurate approximation of the actual system for absolute magnetic field strengths that do not cause saturation, making it useful to calculate the magnetic saturation threshold. For simplicity's sake, the non-saturated soft magnetic material is assumed to have infinite permeability. However, the gaps h1 and h2 between the top cover portions and the bottom cover portion are modeled as respective magnetic resistances R1 and R2, due to the materials of the die 102 and the RDL structure 110 (e.g., silicon, insulation material, copper, aluminum wires, and the like) within the gaps having much lower permeabilities (which are very close to the permeability of vacuum μ0) than the soft magnetic material. The magnetic resistances R1 and R2 may be determined based on the gaps h1 and h2, areas A1 and A2 in which the gaps h1 and h2 are formed, and an approximated permeability of the materials in the gaps (which may be expressed as the approximate relative permeability of the gap materials times the permeability of vacuum):

$$R1 = \frac{h1}{A1 \cdot \mu R \cdot \mu 0}$$

$$R2 = \frac{h2}{A2 \cdot \mu R \cdot \mu 0}$$

The total magnetic flux through the magnetic shielding structure (provided as an input to the circuit in FIG. 3) is equal to the flux φ1 through the sidewall portion 204 plus the flux φ2 through the MRAM array 104, which can be rewritten as $B^\perp$ passing through the combined areas of A1+A2.

Based on the circuit in FIG. 3, field B2 can be determined relative to $B^\perp$:

$$|B2| = \frac{(A1 + A2) \cdot h1}{A1 \cdot h2 + A2 \cdot h1}|B\perp|$$

which is valid if:

$$|B1| = \frac{(A1 + A2) \cdot h2}{A1 \cdot h2 + A2 \cdot h1}|B\perp| < Bsat$$

$$|B3| = \frac{A1}{A3} \cdot \frac{A2|h2 - h1|}{A1 \cdot h2 + A2 \cdot h1}|B\perp| < Bsat$$

$$|B4| = \frac{A1}{A4} \cdot \frac{A2|h2 - h1|}{A1 \cdot h2 + A2 \cdot h1}|B\perp| < Bsat$$

In some embodiments, the magnetic saturation threshold of the soft magnetic material used to implement the magnetic shielding structure may be 0.7 T, although the magnetic saturation threshold may be lesser or greater in other embodiments, depending on the soft magnetic material used.

Since the recess 220 is filled with bulk silicon, which has a permeability much less than the permeability of the soft magnetic material, the magnetic resistance through the recess 220 is much greater than the magnetic resistance through the soft magnetic material of the top cover 108. As a result, the recess 220 is configured to redirect magnetic flux of magnetic induction $B^\perp$ around the MRAM array 104 through the top cover 108 (or the path of least magnetic resistance). Recess 220 is capable of redirection, even without the stack 120 being present. As further discussed below, the recess 220 may be aligned over the MRAM array 104, where the die 102 has a single thickness (e.g., a thinned die having a single back side), where the recess 220 is filled with air. Since air also has a permeability much less than the permeability of the soft magnetic material, the magnetic resistance through the recess 200 is much greater than the magnetic resistance through the soft magnetic material of the top cover 108, and redirects magnetic flux around the MRAM array 104. The bottom cover 118 is also configured to redirect the magnetic flux around the MRAM array 104, to a lesser extent, by providing another path of least magnetic resistance. The bottom cover 118 overlaps the solid portion of the sidewall portion 204 by some amount, in order to minimize any fringe magnetic fields or leakage at the gaps h1 and h2, since top cover 108 and bottom cover 118 do not fully enclose or surround the die 102. For example, gap h1 may be preferred to be 50 microns or less, in some embodiments.

Generally, as the perimeter or footprint 208 of the MRAM array 104 increases (e.g., an 8 Mb array has a larger footprint versus a 2 Mb array), the area A2 of the recess 220 increases appropriately, maintaining the lateral distance 212 between the inner sidewalls 210 of the recess 220 and the outer perimeter 208 of the MRAM array 104. The recess 220 maintains a lateral distance 212 between the inner sidewalls 210 of the recess 220 and the outer perimeter 208 of the MRAM array 104, regardless of whether stack 120 is present or not. The width of the sidewall portion 204 around the MRAM array area, such as (lo–l2)/2 for the left and right portions relative to FIG. 4B, and (wo–w2)/2 for the front and back portions relative to FIG. 4B, should be large enough to provide an adequate area A1 through which magnetic flux from magnetic induction $B^\perp$ can be directed around MRAM array 104 while minimizing the field B2 that passes through the recess 220 and through MRAM array 104. Other values may also be adjusted to ensure that $B^\perp$ is adequately redirected around the MRAM array 104 and B2 remains under the critical field strength. For example, the height h5 of the recess 220 may also be increased as the footprint 208 increases, which generally should be as large as possible while remaining within saturation limits. The height h3 of the top cover 108 over the recess 220 may be reduced as the height h5 of the recess 220 increases, in order to maintain a same overall package thickness, or may be increased to provide an adequate area A3 through which magnetic flux of the magnetic induction $B^\perp$ can be directed around MRAM array 104. The height h4 of the bottom cover 118 may also be increased or decreased, while maintaining an adequate area A4 through which magnetic flux of the magnetic induction $B^\perp$ can be directed around MRAM array 104. Accordingly, the magnetic shielding structure can be tuned to specific requirements of various end products that include die with MRAM arrays.

It is also noted that the top cover 108 and bottom cover 118 may be limited in size to the area on the die 102 that includes the MRAM array 104, and need not cover the entire active side and back side of the die 102 (like that shown in FIG. 1A). It is preferred to keep the lateral size of the top cover 108 and bottom cover 118 as small as possible, while adjusting the dimensions of the top and bottom cover 108 and 118 to ensure the magnetic shielding structure remains within saturation limits. A magnetic shielding structure with a larger lateral size may collect greater magnetic flux, meaning a greater likelihood of saturation. A magnetic shielding structure with a smaller lateral size protects the smaller footprint of the MRAM array 104 (as compared to the footprint of the entire die 102) while limiting magnetic flux. If an MRAM array 104 has an exceedingly large footprint 208 (e.g., a 16 Mb array), such an array may benefit from being split into multiple smaller sub-arrays, where a magnetic shielding structure may be formed for each sub-array, or a single magnetic shielding structure may be formed with a recess for each sub-array. Examples of such embodiments are shown in FIGS. 9A and 9B.

FIGS. 5A, 5B, 5C, 5D, 5E, 5F, 5G, 5H, 5I, and 5J are block diagrams depicting an example process for fabricating a packaged semiconductor device including a magnetic shielding structure for MRAM array. In the embodiment shown, a stack 120 is formed over the MRAM array 104 and a top cover 108 has a recess 220 that is fitted to the stack 120, as further discussed below. While the figures show an individual die 102 fabricated into a device, the die 102 may be representative of a plurality of die on a wafer, where the process steps described below may be applied to all die on the wafer. Such a wafer-level fabrication process is also discussed in connection with FIGS. 6A and 6B.

FIG. 5A shows an active side 130 in a planar bottom-up view of die 102, which includes a plurality of die pads 502 located around the periphery of the die 102. A perimeter of the MRAM array 104 is also shown. While the figures show MRAM array 104 located near the center of the die 102, the MRAM array 104 may be located elsewhere on the active side 130 of the die 102 in different embodiments.

Figure 5B:
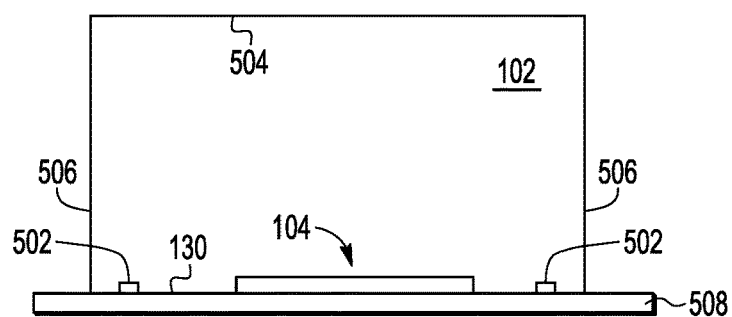

FIG. 5B shows a cross-sectional view of die 102 before any backgrinding or thinning step is performed. Die 102 has an original thickness with an original back side 504 opposite the active side 130, and lateral edges 506 that are perpendicular to the active side 130. The active side 130 of die 102 is attached to a suitable temporary carrier such as a glass carrier 508. As a result, the die 102 is in an active side face-down orientation.

Figure 5C:
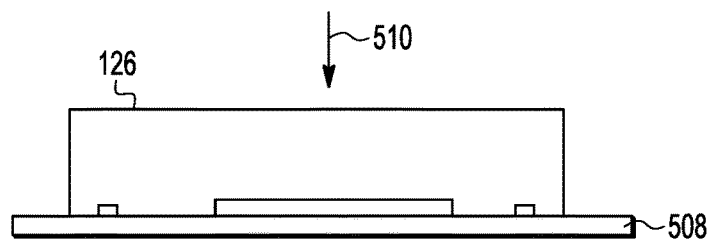

FIG. 5C shows a backgrinding step 510 applied to the back side 504 of the die 102 that removes a portion of the bulk silicon from the back side 504 of the die 102, exposing a new back side 126. In some embodiments, new back side 126 is formed such that the remaining portion of the bulk silicon over the MRAM array 104 has the desired height of the stack 120. In some embodiments, backgrinding (like backgrinding 510) may be performed using a chemical-mechanical polishing (CMP) or other planarization method.

Figure 5D:
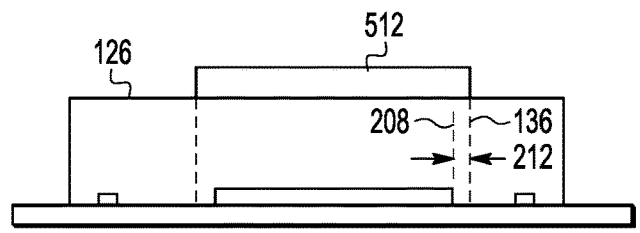
Figure 5E:
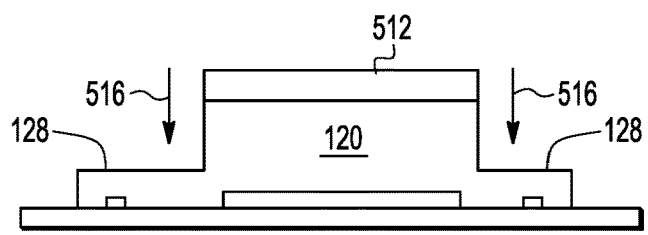

FIG. 5D shows a photoresist mask 512 formed over the back side 126 of die 102 and is used to form stack 120, as further shown in FIG. 5E. The photoresist mask 512 may be deposited as a layer of photoresist material over the back side 126, which is then patterned to leave photoresist mask 512 over and generally aligned with the MRAM array 104. Since there may be some margin of error due to alignment tolerance in the formation of the photoresist mask 512, the photoresist mask 512 is formed to cover an area larger than the footprint 208 of the MRAM array 104 by some lateral distance 212 to ensure that the sidewalls 136 of the resulting stack 120 (as well as the inner sidewalls 210 of the top cover 108) remain outside of the footprint 208. For example, the lateral distance 212 may be on the order of a few microns or a few tens of microns, where the MRAM array 104 may have a footprint 208 on the order of 1.5 mm by 1.5 mm for an 8 mm² die 102. Example photoresist materials include but are not limited to polymer resins that contain a photoactive (or light sensitive) compound.

FIG. 5E shows an etching step 516 applied to the exposed portions of back side 126 of the die 102, which removes another portion of the bulk silicon around photoresist mask 512 from the back side 126 of the die 102, exposing a new back side 128. As a result, stack 120 is formed with sidewalls 136 that are located outside of the footprint 208 of the MRAM array 104. The thickness of the die 102 around the stack 120 may be as thin as 10 to 20 microns or as large as 50 microns, while the stack 120 may be as thick as 200 to 300 microns or greater such as 350 microns, depending on the die thickness requirements. In some embodiments, etching may be performed using a wet or dry etchant that selectively removes the bulk silicon from around photoresist mask 512.

Figure 5F:
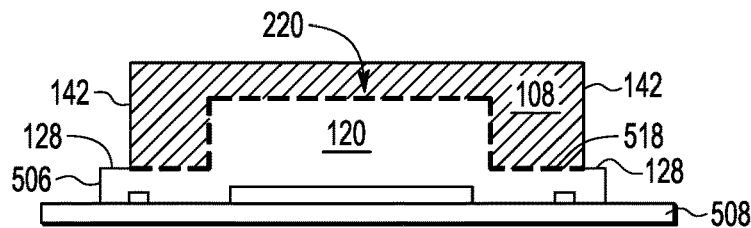

FIG. 5F shows a top cover 108 positioned on the back side of die 102. In the embodiment shown, the back side of die 102 includes both back sides 126 and 128. In some embodiments, top cover 108 is a standalone piece that includes a recess 220 that is substantially fitted to the stack 120, where a depth of the recess corresponds to a height of the stack 120 measured from the back side 126 of die 120. The recess 220 of top cover 108 is configured to fit over and around the stack 120. Since there may be some margin of error due to alignment tolerance in the placement of the top cover 108 on the die 102, the recess 220 is formed to have a cross-sectional area A2 large enough to surround the stack 120, such as by introducing additional lateral distance between the inner sidewalls 210 and the footprint 208 of the MRAM array 104 to ensure that the inner sidewalls 210 surround the sidewalls 136 of the resulting stack 120.

The bottom surface 124 of top cover 108 (relative to the drawing) contacts or sits flush against back side 128. Optionally, an adhesive 518 may be used to secure the top cover 108 to the back side of the die 102, as indicated by the thickened broken line. Adhesive 518 may be optionally placed on any combination of back side 128, back side 126, and sidewalls 136. Examples of an adhesive (like adhesive 518) include but are not limited to solder alloys, polyimides, silicone or epoxy-resin based material containing suspended filler such as carbon nanotubes, or beryllium oxide, aluminum nitride, boron nitride, or diamond powders, and the like. Adhesive 518 may also have thermal conductive properties to transfer heat from the die 102 to the top cover 108.

Top cover 108 also has lateral edges 142. In the embodiment shown, lateral edges 142 do not reach lateral edges 506 of the die 102, leaving a portion of back side 128 exposed. Lateral edges 142 of the top cover 108 may reach lateral edges 506 of the die 102 in other embodiments, where adhesive 518 may be used in such embodiments to secure the top cover 108 to the back side of the die 102.

Figure 5G:
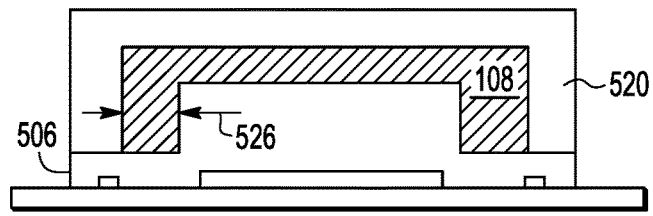
Figure 5H:
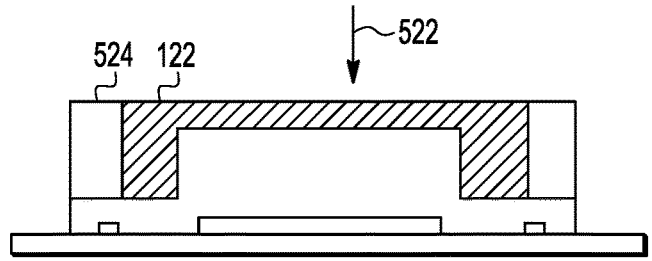

In another embodiment of FIG. 5F, the top cover 108 may be positioned on the back side of the die 102 by being directly formed on the die 102. In such embodiments, the top cover 108 may be formed by depositing (e.g., sputtering, electroplating, casting, screen-printing, and the like) soft-magnetic material over the back sides 126 and 128 of the die 102. In some embodiments, a thin adhesion layer may be needed before depositing the soft-magnetic material, where such a thin adhesion layer may be sputtered. After deposition of the soft-magnetic material, a planarization step is performed (e.g., grinding, polishing, and the like) to create a planar top surface 122 of the top cover 108, where the resulting device has a final package thickness. In such embodiments, the lateral edges 142 of the top cover 108 would extend to the lateral edges 506 of the die 102, similar to that shown in FIGS. 1A and 1B. Such an embodiment would also skip ahead to the process step shown in FIG. 5I, since the overmolding and backgrinding steps of FIGS. 5G and 5H are unnecessary when the top cover 108 is deposited. When implemented in a wafer-level process, the lateral edges 142 and 506 would be formed during a final singulation step by sawing or otherwise separating the devices from a larger wafer, as further discussed below in connection with FIG. 6B.

In embodiments where casting the soft-magnetic material is implemented, casting material may be a mixture of soft-magnetic particles dispersed in a polymer (e.g., epoxy). The casting material should have a high filling factor of particles. Such viscous mixtures might be deposited by screen-printing, for example. For high filling factors, a mixture of different particle sizes may be used, so that smaller particles may fill the spaces between adjacent larger particles. Optionally, the polymer may be, at least in part, a volatile compound that evaporates during curing at elevated temperatures. This may increase the filling factor even more. To prevent build-up of excessive mechanical stress caused by shrinking during the curing and evaporation, it may be necessary to apply vertical pressure (e.g., in a downward direction relative to the drawing) during the curing, so that the casting material may reflow around the die 102. Applying vertical pressure may also achieve planarization of the top surface of the deposited material, where grinding or polishing may not be necessary.

FIG. 5G shows an encapsulation step that overmolds the top cover 108 with molding compound 520. In the embodiment shown, the mold compound 520 attaches to the lateral edges 142 of the top cover 108 and to the exposed portion of back side 128, securely attaching top cover 108 to the die 102, with or without the optional adhesive 518. In some embodiments, the thickness or lateral width 526 of the sidewall portion of the top cover 108 is thin enough to allow for an adequate amount of molding compound to contact the exposed portion of back side 128 while remaining thick enough to satisfy magnetic saturation requirements, discussed above. Examples of molding compound (like molding compound 520) include but are not limited to a biphenyl type or multi-aromatic type epoxy resin, as well as other types of encapsulating materials in other embodiments. The encapsulation step may be performed by an encapsulating method, such as transfer molding, film assisted molding, glob top, dam and fill, underfill, lamination, or other types of other encapsulating methods.

FIG. 5H shows a backgrinding step 522 applied to the top surface of mold compound 520, which exposes a new back side 524 of the mold compound 520 and a top surface 122 of the top cover 108. The device shown in FIG. 5H has a final package thickness. In some embodiments, the exposed top surface 122 of the top cover 108 may be laser marked to indicate information about the device.

Figure 5I:
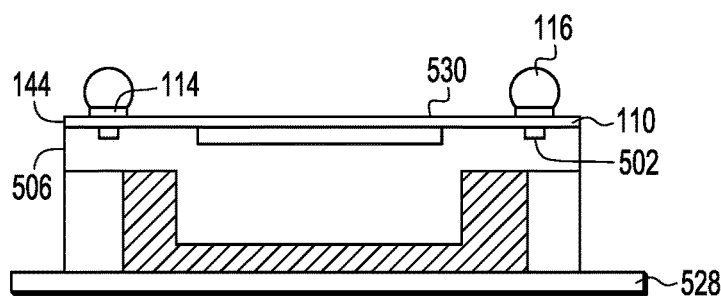

FIG. 5I shows a back side of the resulting device (including back sides 524 and 122 as shown in FIG. 5H) attached to a tape 528 or other suitable temporary carrier, and the glass carrier 508 is removed. The device is flipped in an active side face-up orientation in FIG. 5I. In some embodiments, an RDL structure 110 is formed over the active side 130 of the die 102, where a set of pads 114 are exposed at an outer surface 530 of the RDL structure 110. For example, as further discussed below, multiple RDL structures 110 may be formed over multiple dies 102 as a wafer-level or panel-level process. Each RDL structure 110 may have a substantially uniform height or thickness of 20 to 40 microns, measured from the active side 130 of the die 102 to the outer (dielectric) surface of the RDL structure 110. In some embodiments, the external connections 116, such as solder balls or metal pillars, are attached to the pads 114. In other embodiments, the RDL structure 110 is not formed, and instead the external connections 116 are formed directly on pads 502, as further shown in FIG. 10B. In some embodiments, tape 528 is formed from a polymer film such as PVC (polyvinyl chloride), polyolefin, polyethylene, or similar material, where a die adhesive is placed on a surface of the polymer film. In some embodiments, tape 528 is a dicing tape 528 that is removable in response to UV (ultraviolet light) exposure or temperature excursion (e.g., the die adhesive weakens in response to the UV exposure or temperature excursion) or by using a release layer. Tape 528 releases the device, or releases a plurality of die resulting from singulation of a wafer.

Figure 5J:
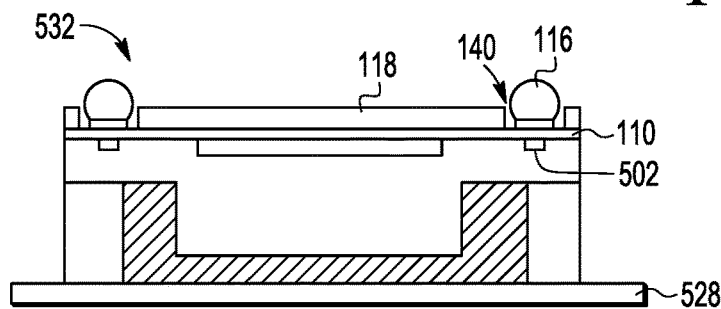
Figure 8A:
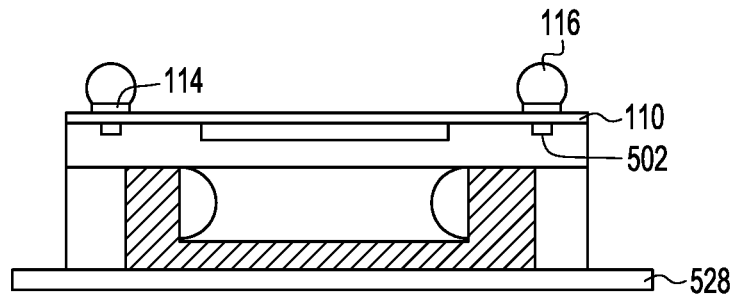
FIGS. 8A, 8B, and 8C are block diagrams depicting example alternative process steps for fabricating a package semiconductor device including a magnetic shielding structure for MRAM array, according to some embodiments of the present disclosure.
Figure 8B:
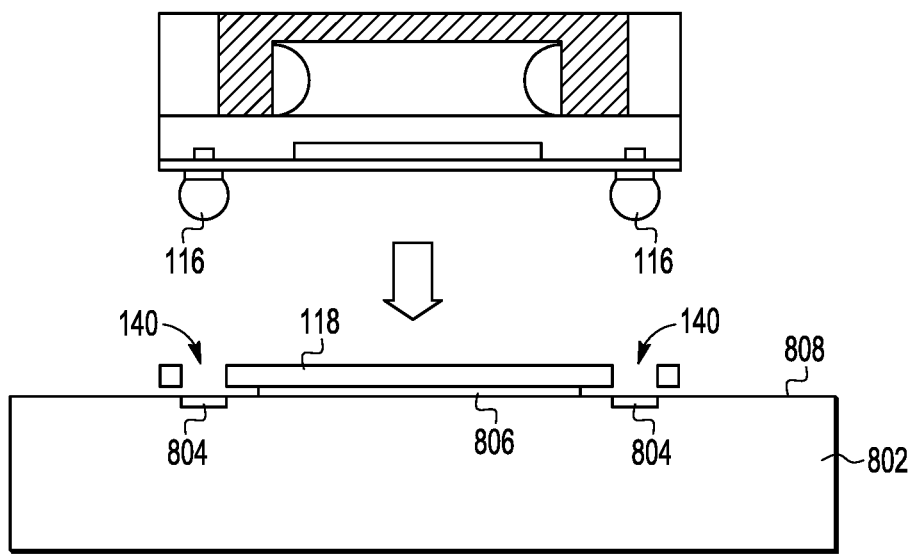
Figure 8C:
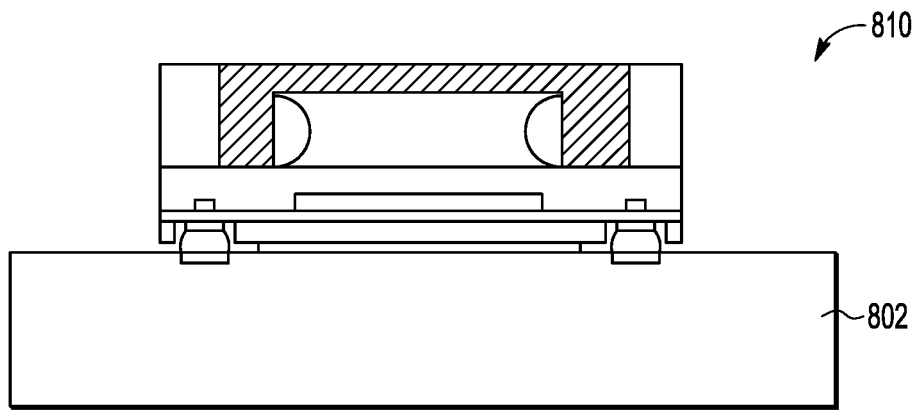

FIG. 5J shows the bottom cover 118 attached to the outer surface 530 of the RDL structure 110, resulting in packaged semiconductor device 532. In the embodiment shown, the bottom cover 118 is attached after the external connections 116 are attached to pads 114. The bottom cover 118 includes a plurality of openings 140 aligned to the external connections 116 and pads 114, where openings 140 have a large enough diameter to fit over the diameter of the external connections 116. In other embodiments, the bottom cover 118 may be attached before the external connections 116 are attached to pads 114. The bottom cover 118 may be attached by an adhesive like adhesive 518 discussed in connection with FIG. 5F. In other embodiments, the bottom cover 118 may be omitted from the device 532 and instead attached to a printed circuit board (PCB) to which the device 532 will be attached, as shown in FIG. 8A-8C.

In another embodiment of FIG. 5J, the bottom cover 118 may be formed on the RDL structure 110 after the RDL structure 110 and pads 114 are completed, but before the external connections 116 are attached to pads 114 (e.g., the process step of FIG. 5I would omit attachment of connections 116). In such embodiments, bottom cover 118 may be formed by depositing (e.g., sputtering, electroplating, casting (which may also be implemented according to the fabrication considerations provided above in connection with FIG. 5F), screen-printing, and the like) soft-magnetic material over the outermost surface of RDL structure 110. In some embodiments, a thin adhesion layer may be needed before depositing the soft-magnetic material, where such a thin adhesion layer may be sputtered. After deposition of the soft-magnetic material, a planarization step may be performed (e.g., grinding, polishing, and the like), if needed, to create a planar outer surface of the bottom cover 118. The plurality of openings 140 are then formed, such as by etching through the bottom cover 118 (and optionally though the adhesion layer) to expose pads 114. The external connections 116 are then attached through the openings 140 to the pads 114. In such embodiments, the lateral edges 144 of the bottom cover 118 would extend to the lateral edges 506 of the die 102, similar to that shown in FIGS. 1A and 1B. When implemented in a wafer-level process, the lateral edges 144 and 506 would be formed during a final singulation step by sawing or otherwise separating the devices from a larger wafer, as further discussed below in connection with FIG. 6B. In some embodiments, the external connections 116 may be metal pillars, where the openings 140 may be used, in part, to define the diameters of the pillars. For example, an insulation material may be deposited to coat bottom cover 118 including the inner sidewall surfaces of the openings 140 while also exposing the underlying pads 114, allowing metal pillars to be grown within each opening 140.

In still other embodiments, the bottom cover 118 may be directly attached to the bottom surface of the die 102, when an RDL structure 110 is not present, as further shown in FIG. 10B. It is noted that the bottom cover 118 shown in FIG. 5J laterally extends past the lateral edges 142 of the top cover 108 and completely overlaps the lateral width 526 of the sidewall portions of top cover 108, while the bottom cover 118 shown in FIG. 10B laterally overlaps a smaller portion of the lateral width 526 of the sidewall portions of top cover 108. The bottom cover 118 may be attached to the die 102 by adhesive or by deposition of the soft-magnetic material over the bottom surface of the die 102, similar to formation of the bottom cover 118 on an RDL structure 110 as described above, where the external connections 116 may be attached before or after attachment of the bottom cover 118 in some embodiments, or after deposition of the bottom cover 118 in other embodiments.

Figure 6A:
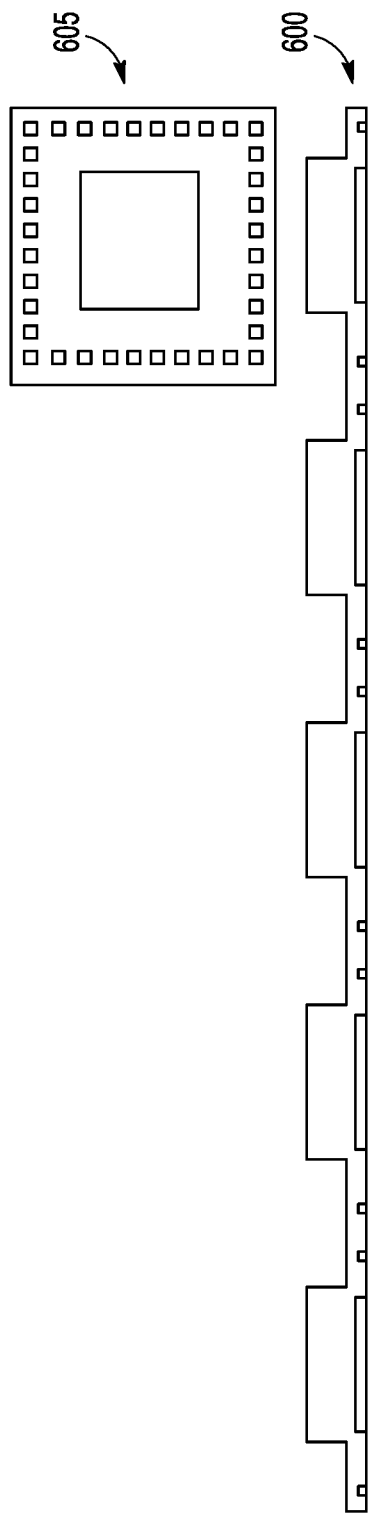
FIGS. 6A and 6B are block diagrams depicting example device views of representative process steps of a wafer level process for fabricating packaged semiconductor devices including magnetic shielding structures for MRAM array, according to some embodiments of the present disclosure.

As noted above, the preceding steps described in connection with an individual die 102 may be applied to a plurality of die 102 on a wafer for a wafer-level or panel-level process embodiment. For example, the corresponding active side of a wafer that includes a plurality of die or a reconstituted wafer or panel that includes a plurality of die surrounded by mold compound may be attached to the glass carrier 508 in FIG. 5B. The backgrinding step 510 may also be applied to the corresponding back side of the entire wafer in FIG. 5C. The photoresist material may be deposited over the back side of the entire wafer and then patterned to leave a photoresist mask 512 over each MRAM array 104 on each die 102 of the wafer in FIG. 5D. The etching step 516 may be applied to the exposed areas of the wafer, resulting in a stack 120 over each MRAM array 104 on each die 102 of the wafer in FIG. 5E. An example wafer 600 resulting from the process steps described in FIG. 5B-5E is shown in FIG. 6A, with a corresponding planar bottom-up view of each die 605.

Figure 6B:
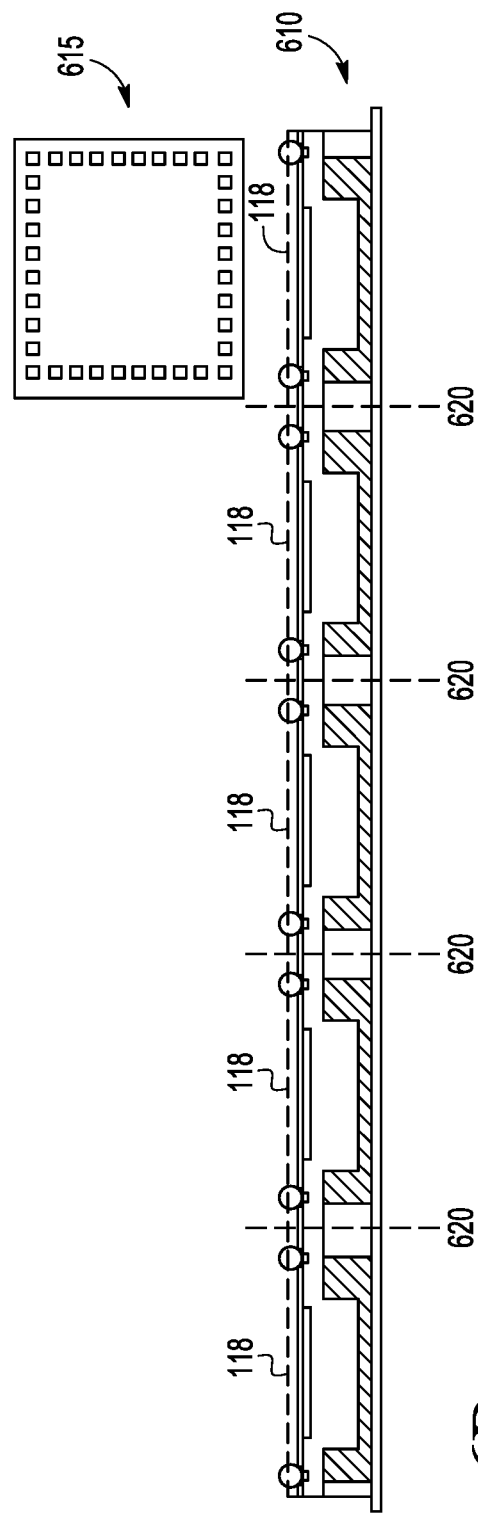

A separate top cover 108 may then be placed (with or without adhesive) on each stack 120 in FIG. 5F, where the top covers 108 on the wafer are overmolded and securely attached in FIG. 5G. In another wafer-level embodiment, an array or panel of top covers 108 may be placed over the back side of the wafer and aligned with the stacks 120, which may be singulated into individual top covers 108 simultaneously with die singulation. The backgrinding step 522 may be applied to the entire wafer to expose all top covers 108 in FIG. 5H, and the RDL structures 110 and external connections 116 may be formed over the wafer in FIG. 5I. In another wafer-level embodiment, a layer of soft-magnetic material is deposited over all back sides of dies 102 (with or without a thin adhesion layer) and planarized to form a plurality of top covers 108 on all dies 102. Finally, a separate bottom cover 118 may be attached to each RDL structure 110 on each die 102 of the wafer in FIG. 5J. In another wafer-level embodiment, an array or panel of bottom covers 118 may be attached to the RDL structures 110 on the wafer. In another wafer-level embodiment, a layer of soft-magnetic material is deposited over all RDL structures 110 (with or without a thin adhesion layer), planarized, and etched with openings 140 to form a plurality of bottom covers 118 on all dies 102, where the external connections 116 are attached to pads 114 after the fabrication of the bottom covers 118. In yet another wafer-level embodiment, the attachment of bottom covers 118 may be omitted, where the bottom cover 118 may be attached to a printed circuit board (PCB), and the resulting packaged semiconductor device is attached to the PCB and aligned with the bottom cover 118, as further described below in connection with FIG. 8A-8C. An example wafer 610 resulting from the process steps described in FIG. 5F-5J is shown in FIG. 6B, with a corresponding planar bottom-up view of each device 615. The bottom covers 118 may be optionally attached to the resulting devices 615, or may be omitted from devices 615 and instead attached to a PCB, as indicated by the bottom cover 118 shown in dashed outline. A singulation step 620 then separates the device wafer 610 into a plurality of packaged semiconductor devices 615, forming vertical lateral edges of the devices.

FIGS. 7A, 7B, 7C, 7D, 7E, 7F, 7G, and 7H are block diagrams depicting another example process for fabricating a packaged semiconductor device including a magnetic shielding structure for MRAM array. In the embodiment shown, no stack is formed over the MRAM array 104, where the die 102 has a single back side and thickness. The top cover 108 still has a recess 220 that is fitted over the MRAM array 104, as further discussed below. While the figures show an individual die 102 fabricated into a device, the die 102 may be representative of a plurality of die on a wafer, where the process steps described below may be applied to all die on the wafer, in a similar manner to that discussed above in connection with FIGS. 6A and 6B. Additional embodiments of a wafer-level fabrication process for a die that includes multiple MRAM sub-arrays are also discussed in connection with FIGS. 9A and 9B.

Figure 7A:
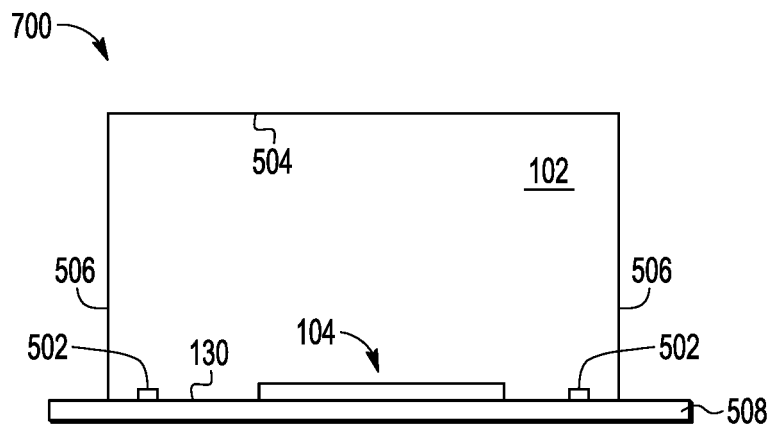
FIGS. 7A, 7B, 7C, 7D, 7E, 7F, 7G, and 7H are block diagrams depicting another example process for fabricating a packaged semiconductor device including a magnetic shielding structure for MRAM array, according to some embodiments of the present disclosure.

FIG. 7A shows a cross-sectional view of die 102 before any backgrinding or thinning step is performed. Die 102 has an original thickness with an original back side 504 opposite an active side 130, with lateral edges 506 that are perpendicular to active side 130. The active side 130 is attached to a suitable temporary carrier, such as a glass carrier 508. As a result, the die 102 is in an active side face-down orientation. MRAM array 104 is also shown to be located in an off-center position on the active side 130.

Figure 7B:
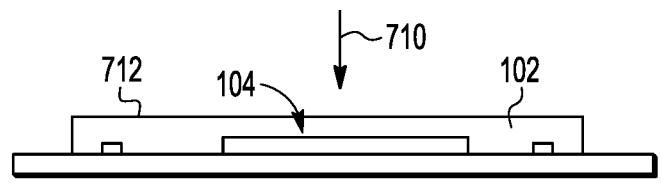

FIG. 7B shows a backgrinding step 710 applied to the back side 504 of die 102 that removes a portion of the bulk silicon from the back side 504 of the die 102, exposing a new back side 712 across the entirety of the die 102. The thickness of the die 102 in FIG. 7B is the final uniform thickness of the die 102, which may be 10 to 20 microns in some embodiments.

Figure 7C:
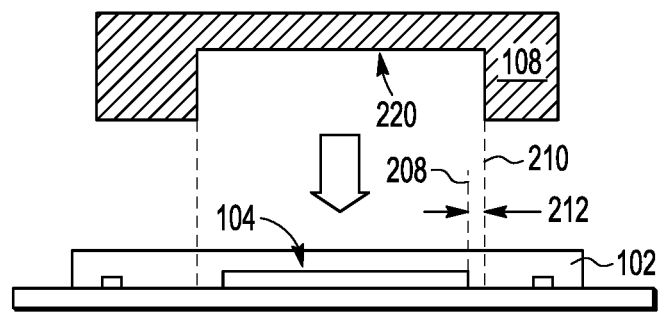

FIG. 7C shows a top cover 108 positioned over the back side of die 102. In the embodiment shown, the back side of die 102 includes back side 712. Top cover 108 includes a recess 220 that is configured to remain over the MRAM array 104. The recess 220 has inner sidewalls 210 in top cover 108. Since there may be some margin of error due to alignment tolerance in the placement of the top cover 108 on the die 102, the recess 220 is formed to have a cross-sectional area A2 (as defined by inner sidewalls 210) larger than the footprint 208 of MRAM array 104 by some lateral distance 212 to ensure that the recess 220 is adequately positioned over the MRAM array 104, where the sidewalls 210 remain outside of the footprint 208. Lateral distance 212 may be on the order of a few microns or a few tens of microns.

Figure 7D:
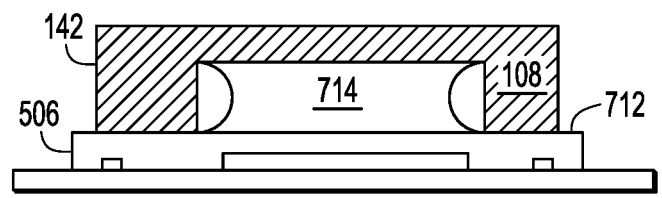

FIG. 7D shows top cover 108 attached to the back side 712 of the die 102 by adhesive 714. In the embodiment shown, adhesive 714 attaches to the surfaces within the recess 220 and to the back side of the die 712, securely attaching top cover 108 to the die 102. Adhesive 714 may be placed in recess 220 before placing the top cover 108 on the die 102, where the bottom surface 124 of top cover 108 contacts or sits flush against back side 712. In other embodiments, additional adhesive may optionally be placed on back side 712 to further secure the top cover 108. Adhesive 714 may be similar to adhesive 514, and may also have thermal conductive properties.

Top cover 108 also has lateral edges 142. In the embodiment shown, lateral edges 142 do not reach lateral edges 506 of the die 102, leaving a portion of back side 712 exposed. Lateral edges 142 of the top cover 108 may reach lateral edges 506 of the die 102 in other embodiments, where adhesive 714 may be used to secure top cover 108 to the die 102.

Figure 7E:
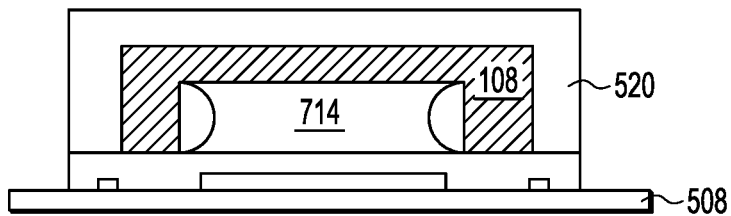

FIG. 7E shows an encapsulation step that overmolds the top cover 108 with molding compound 520. In the embodiment shown, the mold compound 520 attaches to the lateral edges 142 of the top cover 108 and to the exposed portion of back side 712.

Figure 7F:
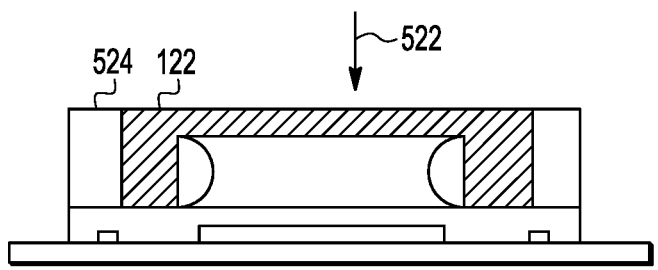

FIG. 7F shows a backgrinding step 722 applied to the top surface of mold compound 520, which exposes a new back side 524 of the mold compound 520 and a top surface 122 of the top cover 108. The device shown in FIG. 7F has a final package thickness.

Figure 7G:
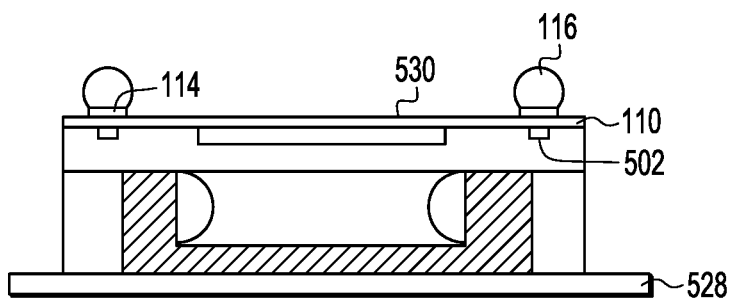

FIG. 7G shows a back side of the resulting device (including back sides 524 and 122) attached to a tape 528 or other suitable temporary carrier, and the glass carrier 508 is removed. The device is flipped in an active side face-up orientation in FIG. 7G. In some embodiments, an RDL structure 110 is formed over the active side 130 of the die 102, where a set of pads 114 are exposed at an outer surface 530 of the RDL structure 110. For example, as further discussed below, multiple RDL structures 110 may be formed over multiple dies 102 as a wafer-level or panel-level process. Each RDL structure 110 may have a substantially uniform height or thickness of 20 to 40 microns, measured from the active side 130 of the die 102 to the outer (dielectric) surface of the RDL structure 110. In some embodiments, external connections 116, such as solder balls or metal pillars, are attached to the pads 114.

Figure 7H:
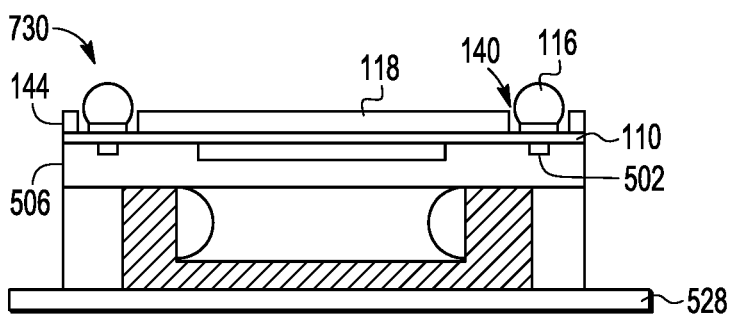

FIG. 7H shows the bottom cover 118 attached to the outer surface 530 of RDL structure 110, resulting in packaged semiconductor device 730. In the embodiment shown, the bottom cover 118 is attached after the external connections 116 are attached to pads 114. The bottom cover 118 includes a plurality of openings 140 aligned to the external connections 116 and pads 114, where openings 140 have a large enough diameter to fit over the diameter of the external connections 116. In other embodiments, the bottom cover 118 may be attached before the external connections 116 are attached to pads 114. The bottom cover 118 may be attached by an adhesive like adhesive 714 discussed above. In other embodiments, the bottom cover 118 may be omitted from device 730 and instead attached to a PCB to which the device 730 will be attached, as shown in FIG. 8A-8C.

In another embodiment of FIG. 7H, the bottom cover 118 may be formed on the RDL structure 110 after the RDL structure 110 and pads 114 are completed, but before the external connections 116 are attached to pads 114, in a manner similar to that discussed above in connection with FIG. 5J, where the bottom cover 118 may be attached by adhesive or deposited on the RDL structure 110. In still other embodiments, the bottom cover 118 may be directly attached to the bottom surface of the die 102, when an RDL structure 110 is not present, as further shown in FIG. 10A. It is noted that the bottom cover 118 shown in FIG. 7H laterally extends past the lateral edges 142 of the top cover 108 and completely overlaps the lateral width 526 of the sidewall portions of top cover 108, while the bottom cover 118 shown in FIG. 10A laterally overlaps a smaller portion of the lateral width 526 of the sidewall portions of top cover 108. The bottom cover 118 may be attached to the die 102 by adhesive or by deposition of the soft-magnetic material over the bottom surface of the die 102, similar to formation of the bottom cover 118 on an RDL structure 110 as described above, where the external connections 116 may be attached before or after attachment of the bottom cover 118 in some embodiments, or after deposition of the bottom cover 118 in other embodiments. Additionally, the external connections 116 in any of the above embodiments may be metal pillars, where the openings 140 may be used, in part, to define the diameters of the pillars that are grown within the openings 140.

FIGS. 8A, 8B, and 8C are block diagrams depicting example alternative process steps for fabricating a package semiconductor device including a magnetic shielding structure for MRAM array. FIG. 8A shows a device like that shown in FIG. 7G, but a device like that shown in FIG. 5I may also be used in the alternative process steps.

FIG. 8B shows that bottom cover 118 of the magnetic shielding structure is attached to printed circuit board (PCB) 802 by adhesive 806, which may be similar to the other adhesives described above. The bottom cover 118 includes a plurality of openings 140 aligned to landing pads 804 on the PCB 802, where openings 140 have a large enough diameter to allow the diameter of the external connections 116 on the device in FIG. 8A to pass through the openings 140 and contact landing pads 804 when the device is placed on the PCB. Printed circuit board (PCB) includes electrically conductive features on a non-conductive substrate. PCB may be a flexible type PCB using polyimide or a rigid type PCB using FR4 or BT resin. The package semiconductor device may be attached and electrically connected to the PCB by a number of external connections, such as solder balls or metal pillars.

FIG. 8C shows the device is attached to the PCB and aligned with the bottom cover 118. In some embodiments, the external connections 116 are bonded to the landing pads 804 (e.g., reflow), which provides adequate attachment of the device to the PCB. In other embodiments, another layer of adhesive 806 is used to attach the outer surface 530 of the RDL structure 110 onto the bottom cover 118.

As noted above, an MRAM array 104 may benefit from being split into multiple smaller sub-arrays, where a magnetic shielding structure may be formed for each sub-array, which is shown in FIG. 9A. Alternatively, a single magnetic shielding structure may be formed with a recess for each sub-array, which is shown in FIG. 9B. FIG. 9A and FIG. 9B also show such embodiments as part of a wafer level process, although an individual die process may be implemented in other embodiments.

FIG. 9A shows an example wafer 905 that includes a plurality of die 900, with a corresponding planar bottom-up view of each die 900. Each die 900 includes an MRAM array that includes at least a first sub-array 104 and a second sub-array 904, and may include additional sub-arrays in other embodiments. The first and second sub-arrays 104 and 904 may be located in different locations, or at least with enough distance between the sub-arrays to allow for the lateral width of sidewall portions of an individual top cover 108 (and top cover 908) to be placed over each sub-array. The space between the sub-arrays may be used to place memory periphery circuits, such as address decoders, read amplifiers, error correction circuits, and the like. Top covers 108 and 908 respective include a recess 220 and 920 that are respectively positioned over sub-arrays 104 and 904. In other words, each sub-array has its own recess, where sub-arrays preferably do not share recesses. In some embodiments, a stack 120 may be formed over each sub-array, where recesses 220 and 920 fit over and around the stacks 120, in a manner as similarly described above. In other embodiments, a stack need not be formed, where each top cover 108 and 908 are placed such that recesses 220 and 920 are aligned over sub-arrays 104 and 904, in a manner as similarly described above (e.g., in connection with 7D). Bottom covers 118 may be optionally attached (as indicated by the dashed outline) as either individual covers or as a panel of covers or may be omitted, as similarly described above. A singulation step 620 then separates the device wafer 905 into a plurality of package semiconductor devices.

FIG. 9B shows an example wafer 910 that includes a plurality of die, like that described in connection with FIG. 9A. However, rather than having an individual top cover 108 (and 908) over each MRAM sub-array 104 and 904, a single top cover 108 may have multiple recesses aligned to each sub-array. For example, top cover 108 includes a recess 220 aligned to sub-array 104 and a recess 920 aligned to sub-array 904. In some embodiments, a stack 120 may be formed over each sub-array, where recesses 220 and 920 fit over and around the stacks 120, in a manner as similarly described above. In other embodiments, a stack need not be formed, where each top cover 108 and 908 are placed such that recesses 220 and 920 are aligned over sub-arrays 104 and 904, in a manner as similarly described above (e.g., in connection with 7D). Bottom covers 118 may be optionally attached (as indicated by the dashed outline) as either individual covers or as a panel of covers or may be omitted, as similarly described above. A singulation step 620 then separates the device wafer 905 into a plurality of package semiconductor devices.

A semiconductor die (like semiconductor die 102) may be formed from (e.g., singulated from) a semiconductor wafer, which can be any semiconductor material or combinations of materials, such as gallium arsenide, silicon germanium, silicon-on-insulator (SOI), silicon, monocrystalline silicon, the like, and combinations of the above. The active circuitry of a semiconductor die (like semiconductor die 102) is formed on a silicon wafer using a sequence of numerous process steps applied to semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of active circuitry include but are not limited to integrated circuit components such as a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

By now it should be appreciated that there has been provided a magnetic shielding structure made of a soft magnetic material that reduces magnetic disturbs for an MRAM array, which may include one or more sub-arrays. The magnetic shielding structure includes a top cover that in turn includes a recess aligned to each sub-array, where the recess is filled with either air or silicon or both and provides a magnetic resistance greater than the magnetic resistance of the shielding structure, which redirects magnetic flux around the MRAM cell array.

In one embodiment of the present disclosure, a packaged semiconductor device is provided, which includes: a semiconductor die having an active side and an opposite back side, the semiconductor die including a magnetoresistive random access memory (MRAM) cell array formed within an MRAM area on the active side of the semiconductor die; and a top cover includes a soft-magnetic material positioned on the back side of the semiconductor die, wherein the top cover includes a recess formed in a first major surface of the top cover, the first major surface faces the back side of the semiconductor die, and the recess is positioned over the MRAM cell array.

One aspect of the above embodiment provides that sidewalls of the recess are separated from a perimeter of the MRAM cell array by a spacing distance.

Another aspect of the above embodiment provides that the semiconductor die further includes active circuitry formed within a circuitry area on the active side, the active circuitry laterally adjacent to the MRAM cell array, and a first portion of the semiconductor die has a first thickness in the circuitry area.

A further aspect of the above embodiment provides that a second portion of the semiconductor die has a second thickness in the MRAM area that is greater than the first thickness, the second portion forming a stack positioned vertically adjacent to the MRAM cell array, and the recess is sized to fit over and surround the stack.

A still further aspect of the above embodiment provides that the recess is formed to a depth that corresponds to a difference between a back side of the semiconductor die in the circuitry area and a back side of the semiconductor die in the MRAM area.

Another still further aspect of the above embodiment provides that the first major surface of the top cover makes direct contact with the back side of the semiconductor die in the circuitry area.

Another still further aspect of the above embodiment provides that the packaged semiconductor device further includes: a mold body directly contacts and attaches to lateral edges of the top cover and to the back side of the semiconductor die in the circuitry area.

Another still further aspect of the above embodiment provides that the first major surface of the top cover is attached with adhesive to the back side of the semiconductor die in the circuitry area.

Another still further aspect of the above embodiment provides that an inner surface of the recess is attached with adhesive to sidewalls and back side of the stack.

Another further aspect of the above embodiment provides that a second portion of the semiconductor die has the first thickness in the MRAM area, and an inner surface of the recess is attached with adhesive to the back side of the semiconductor die in the MRAM area.

Another aspect of the above embodiment provides that the packaged semiconductor device further includes: a redistributed layer (RDL) structure formed over the active side of the semiconductor die, the RDL structure including a plurality of metal structures that electrically contact a plurality of die pads on the active side of the semiconductor die, the plurality of metal structures providing a plurality of external contact pads on an outermost surface of the RDL structure; and a plurality of solder balls attached to the plurality of external contact pads.

A further aspect of the above embodiment provides that packaged semiconductor device further includes: a bottom cover including the soft-magnetic material having a second major surface positioned on the outermost surface of the RDL structure, wherein the bottom cover includes a plurality of openings aligned to the plurality of solder balls.

A still further aspect of the above embodiment provides that a combined height is measured between the second major surface of the bottom cover and the first major surface of the top cover, and a lateral spacing distance between sidewalls of the recess and a perimeter of the MRAM cell array has a larger value than the combined height.

Another still further aspect of the above embodiment provides that lateral edges of the bottom cover overlap at least a portion of the lateral width of sidewall portions of the top cover.

Another still further aspect of the above embodiment provides that the semiconductor die is one of a plurality of semiconductor dies in a panel, the top cover is one of a plurality of top covers positioned on back sides of the plurality of semiconductor dies, the RDL structure is one of a plurality of RDL structures formed over active sides of the plurality of semiconductor dies, the plurality of solder balls are part of a larger plurality of solder balls attached to the plurality of external contact pads on outermost surfaces of each of the plurality of RDL structures, and the bottom cover is one of a plurality of bottom covers positioned on outermost surfaces of the plurality of RDL structures.

Another aspect of the above embodiment provides that the packaged semiconductor device further includes: a bottom cover including the soft-magnetic material positioned on the active side of the semiconductor die, wherein the bottom cover includes a plurality of openings aligned to a plurality of die pads on the active side of the semiconductor die; and a plurality of solder balls attached to the plurality of die pads.

Another further aspect of the above embodiment provides that the packaged semiconductor device further includes: a printed circuit board (PCB) having a plurality of bond pads on a front side of the PCB; and a bottom cover including the soft-magnetic material attached to the front side of the PCB, wherein the bottom cover includes a plurality of openings aligned to the plurality of bond pads, wherein each bond pad is exposed within each opening, and the plurality of solder balls are attached to the plurality of bond pads through the plurality of openings in the bottom cover.

Another aspect of the above embodiment provides that the packaged semiconductor device further includes: a second top cover including the soft-magnetic material, a second recess formed in a first major surface of the second top cover, wherein the semiconductor die further includes a second MRAM array, and the second recess is positioned over the second MRAM cell array.

Another aspect of the above embodiment provides that the semiconductor die further includes a second MRAM array, and the top cover further includes a second recess formed in the first major surface of the top cover, the second recess positioned over the second MRAM cell array.

Another aspect of the above embodiment provides that the soft-magnetic material has a relative permeability greater than 50.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

As used herein, the terms "approximately" and "about" mean a value close to or within an acceptable range of an indicated value, amount, or quality, which also includes the exact indicated value itself. It is noted that the term "laterally" as used herein means "in a sideways direction" (e.g., a horizontal direction that is parallel to a plane of the substrate), and the term "space" indicates a void or volume in which material is absent.

Also as used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value.

Although the invention is described herein with reference to specific embodiments, various modifications and changes can be made without departing from the scope of the present invention as set forth in the claims below. For example, additional or fewer recesses may be implemented in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
 a semiconductor die having an active side and an opposite back side, the semiconductor die including a magnetoresistive random access memory (MRAM) cell array formed within an MRAM area on the active side of the semiconductor die, the semiconductor die also having active circuitry formed within a circuitry area on the active side, the active circuitry laterally adjacent to the MRAM cell array; and a top cover comprising a soft-magnetic material positioned on the back side of the semiconductor die, wherein
the top cover comprises a recess formed in a first major surface of the top cover,
the first major surface faces the back side of the semiconductor die, and
the recess is positioned over the MRAM cell array, wherein:
a first portion of the semiconductor die has a first thickness in the circuitry area,
a second portion of the semiconductor die has a second thickness in the MRAM area that is greater than the first thickness, the second portion forming a stack positioned vertically adjacent to the MRAM cell array, and
the recess is sized to fit over and surround the stack.

2. The packaged semiconductor device of claim 1, wherein
sidewalls of the recess are separated from a perimeter of the MRAM cell array by a spacing distance.

3. The packaged semiconductor device of claim 1, wherein
the recess is formed to a depth that corresponds to a difference between a back side of the semiconductor die in the circuitry area and a back side of the semiconductor die in the MRAM area.

4. The packaged semiconductor device of claim 1, wherein
the first major surface of the top cover makes direct contact with the back side of the semiconductor die in the circuitry area.

5. The packaged semiconductor device of claim 1, further comprising:
a mold body directly contacts and attaches to lateral edges of the top cover and to the back side of the semiconductor die in the circuitry area.

6. The packaged semiconductor device of claim 1, wherein
the first major surface of the top cover is attached with adhesive to the back side of the semiconductor die in the circuitry area.

7. The packaged semiconductor device of claim 1, wherein
an inner surface of the recess is attached with adhesive to sidewalls and back side of the stack.

8. A packaged semiconductor device comprising:
a semiconductor die having an active side and an opposite back side, the semiconductor die including a magnetoresistive random access memory (MRAM) cell array formed within an MRAM area on the active side of the semiconductor die;
a top cover comprising a soft-magnetic material positioned on the back side of the semiconductor die, wherein
the top cover comprises a recess formed in a first major surface of the top cover,
the first major surface faces the back side of the semiconductor die, and
the recess is positioned over the MRAM cell array;
a redistributed layer (RDL) structure formed over the active side of the semiconductor die wherein lateral edges of the semiconductor die extend fully to lateral edges of the RDL structure such that the lateral edges of the RDL structure are coincident to the lateral edges of the die, the RDL structure comprising a plurality of metal structures that electrically contact a plurality of die pads on the active side of the semiconductor die, the plurality of metal structures providing a plurality of external contact pads on an outermost surface of the RDL structure;
a plurality of solder balls attached to the plurality of external contact pads; and
a bottom cover comprising the soft-magnetic material having a second major surface positioned on the outermost surface of the RDL structure wherein
the bottom cover comprises a plurality of openings aligned to the plurality of solder balls wherein each opening of the plurality of openings surrounds at least a portion of a solder ball of the plurality of solder balls.

9. The packaged semiconductor device of claim 8, wherein
a combined height is measured between the second major surface of the bottom cover and the first major surface of the top cover, and
a lateral spacing distance between sidewalls of the recess and a perimeter of the MRAM cell array has a larger value than the combined height.

10. The packaged semiconductor device of claim 8, wherein
lateral edges of the bottom cover overlap at least a portion of the lateral width of sidewall portions of the top cover.

11. The packaged semiconductor device of claim 8, wherein
the semiconductor die is one of a plurality of semiconductor dies in a panel,
the top cover is one of a plurality of top covers positioned on back sides of the plurality of semiconductor dies,
the RDL structure is one of a plurality of RDL structures formed over active sides of the plurality of semiconductor dies,
the plurality of solder balls are part of a larger plurality of solder balls attached to the plurality of external contact pads on outermost surfaces of each of the plurality of RDL structures, and
the bottom cover is one of a plurality of bottom covers positioned on outermost surfaces of the plurality of RDL structures.

12. A packaged semiconductor device, comprising:
a semiconductor die having an active side and an opposite back side, the semiconductor die including a magnetoresistive random access memory (MRAM) cell array formed within an MRAM area on the active side of the semiconductor die;
a top cover comprising a soft-magnetic material positioned on the back side of the semiconductor die, wherein
the top cover comprises a recess formed in a first major surface of the top cover,
the first major surface faces the back side of the semiconductor die, and
the recess is positioned over the MRAM cell array, and
the soft-magnetic material is a material that is configured to be magnetized in a magnetic field and not magnetized when the magnetic field is removed; and
a bottom cover comprising the soft-magnetic material positioned on the active side of the semiconductor die, wherein
the bottom cover comprises a plurality of openings aligned to a plurality of die pads on the active side of the semiconductor die; and a plurality of solder balls attached to the plurality of die pads, wherein each opening of the plurality of openings surrounds at least a portion of a solder ball of the plurality of solder balls.

13. The packaged semiconductor device of claim 8, further comprising:
a printed circuit board (PCB) having a plurality of bond pads on a front side of the PCB, wherein:
the plurality of solder balls are attached to the plurality of bond pads through the plurality of openings in the bottom cover.

14. The packaged semiconductor device of claim 1, further comprising:
a second top cover comprising the soft-magnetic material,
a second recess formed in a first major surface of the second top cover, wherein
the semiconductor die further comprises a second MRAM array, and
the second recess is positioned over the second MRAM cell array.

15. The packaged semiconductor device of claim 1, wherein
the semiconductor die further comprises a second MRAM array, and
the top cover further comprises a second recess formed in the first major surface of the top cover, the second recess positioned over the second MRAM cell array.

16. The packaged semiconductor device of claim 1, wherein
the soft-magnetic material has a relative permeability greater than 50.

17. The packaged semiconductor device of claim 8, wherein the soft-magnetic material is a material that is configured to be magnetized in a magnetic field and not magnetized when the magnetic field is removed.

18. The packaged semiconductor device of claim 8, wherein the RDL structure is formed directly on the active side of the semiconductor die.

19. The packaged semiconductor device of claim 8, wherein
a second portion of the semiconductor die has the first thickness in the MRAM area, and
an inner surface of the recess is attached with adhesive to the back side of the semiconductor die in the MRAM area.

\* \* \* \* \*